(12) United States Patent
Ranalli et al.

(10) Patent No.: US 9,306,143 B2
(45) Date of Patent: Apr. 5, 2016

(54) HIGH EFFICIENCY THERMOELECTRIC GENERATION

(71) Applicant: Gentherm Incorporated, Northville, MI (US)

(72) Inventors: Marco Ranalli, Augsburg (DE); Martin Adldinger, Holzheim (DE); Douglas T. Crane, Altadena, CA (US)

(73) Assignee: Gentherm Incorporated, Northville, MI (US)

(*) Notice: Subject to any disclaimer, the term of this patent is extended or adjusted under 35 U.S.C. 154(b) by 89 days.

(21) Appl. No.: 13/954,786

(22) Filed: Jul. 30, 2013

(65) Prior Publication Data

US 2014/0034102 A1 Feb. 6, 2014

Related U.S. Application Data

(60) Provisional application No. 61/678,511, filed on Aug. 1, 2012, provisional application No. 61/678,975, filed on Aug. 2, 2012.

(51) Int. Cl.
*H01L 35/30* (2006.01)
*F01N 5/02* (2006.01)
(Continued)

(52) U.S. Cl.
CPC *H01L 35/30* (2013.01); *F01N 5/02* (2013.01); *F01N 5/025* (2013.01); *F01N 13/087* (2013.01);
(Continued)

(58) Field of Classification Search
CPC .................. H01L 35/00–35/34; H01L 27/16
USPC ................................................. 136/200–242
See application file for complete search history.

(56) References Cited

U.S. PATENT DOCUMENTS 413,136 A 10/1889 Dewey
1,120,781 A 12/1914 Altenkirch et al.
(Continued)

FOREIGN PATENT DOCUMENTS

CN 1195090 A 10/1998
CN 1249067 A 3/2000
(Continued)

OTHER PUBLICATIONS

Crane, D. T.: "Progress Towards Maximizing the Performance of a thermoelectric Power Generator", ICT '06, 25th, USA, IEEE, Aug. 1, 2006, 11-16l.
(Continued)

*Primary Examiner* — Bach Dinh
(74) *Attorney, Agent, or Firm* — Knobbe, Martens, Olson & Bear LLP

(57) ABSTRACT

A thermoelectric power generating system is provided that includes at least one thermoelectric assembly. The at least one thermoelectric assembly includes at least one first heat exchanger in thermal communication with at least a first portion of a first working fluid. The first portion of the first working fluid flows through the at least one thermoelectric assembly. The at least one thermoelectric assembly includes a plurality of thermoelectric elements in thermal communication with the at least one first heat exchanger. The at least one thermoelectric assembly further includes at least one second heat exchanger in thermal communication with the plurality of thermoelectric elements and with a second working fluid flowing through the at least one thermoelectric assembly. The second working fluid is cooler than the first working fluid. The thermoelectric power generating system further includes at least one heat exchanger portion configured to have at least some of the first portion of the first working fluid flow through the at least one heat exchanger portion after having flowed through the at least one thermoelectric assembly. The at least one heat exchanger portion is configured to recover heat from the at least some of the first portion of the first working fluid.

13 Claims, 20 Drawing Sheets

(51) Int. Cl.
*F01N 13/08* (2010.01)
*H01L 27/16* (2006.01)
*F01N 3/20* (2006.01)

(52) U.S. Cl.
CPC ........... *F01N 3/2006* (2013.01); *F01N 2240/02* (2013.01); *F01N 2240/36* (2013.01); *F01N 2410/00* (2013.01); *H01L 27/16* (2013.01); *Y02T 10/16* (2013.01)

(56) References Cited

U.S. PATENT DOCUMENTS

| | | |
|---|---|---|
| 2,027,534 A | 1/1936 | Ingersoll |
| 2,362,259 A | 11/1944 | Findley |
| 2,363,168 A | 11/1944 | Findley |
| 2,499,901 A | 3/1950 | Brown, Jr. |
| 2,519,241 A | 8/1950 | Findley |
| 2,944,404 A | 7/1960 | Fritts |
| 2,992,538 A | 7/1961 | Siegfried |
| 3,004,393 A | 10/1961 | Alsing |
| 3,006,979 A | 10/1961 | Rich |
| 3,019,609 A | 2/1962 | Pietsch |
| 3,070,645 A | 12/1962 | Tracht |
| 3,071,495 A | 1/1963 | Hanlein |
| 3,129,116 A | 4/1964 | Corry |
| 3,137,142 A | 6/1964 | Venema |
| 3,178,895 A | 4/1965 | Mole et al. |
| 3,196,620 A | 7/1965 | Elfving et al. |
| 3,197,342 A | 7/1965 | Neild, Jr. |
| 3,213,630 A | 10/1965 | Mole |
| 3,391,727 A | 7/1968 | Armenag Topouszian |
| 3,505,728 A | 4/1970 | Hare et al. |
| 3,522,106 A | 7/1970 | Debiesse et al. |
| 3,527,621 A | 9/1970 | Newton |
| 3,554,815 A | 1/1971 | Osborn |
| 3,599,437 A | 8/1971 | Panas |
| 3,607,444 A | 9/1971 | DeBucs |
| 3,615,869 A | 10/1971 | Barker et al. |
| 3,626,704 A | 12/1971 | Coe, Jr. |
| 3,635,037 A | 1/1972 | Hubert |
| 3,663,307 A | 5/1972 | Mole |
| 3,681,929 A | 8/1972 | Schering |
| 3,726,100 A | 4/1973 | Widakowich |
| 3,817,043 A | 6/1974 | Zoleta |
| 3,880,674 A | 4/1975 | Saunders |
| 3,885,126 A | 5/1975 | Sugiyama et al. |
| 3,958,324 A | 5/1976 | Alais et al. |
| 3,973,524 A | 8/1976 | Rubin |
| 4,038,831 A | 8/1977 | Gaudel et al. |
| 4,047,093 A | 9/1977 | Levoy |
| 4,055,053 A | 10/1977 | Elfving |
| 4,056,406 A | 11/1977 | Markman et al. |
| 4,065,936 A | 1/1978 | Fenton et al. |
| 4,095,998 A | 6/1978 | Hanson |
| 4,125,122 A | 11/1978 | Stachurski |
| 4,211,889 A | 7/1980 | Kortier et al. |
| 4,281,516 A | 8/1981 | Berthet et al. |
| 4,297,841 A | 11/1981 | Cheng |
| 4,297,849 A | 11/1981 | Buffet |
| 4,386,596 A | 6/1983 | Tuckey |
| 4,402,188 A | 9/1983 | Skala |
| 4,420,940 A | 12/1983 | Buffet |
| 4,448,028 A | 5/1984 | Chao et al. |
| 4,448,157 A | 5/1984 | Eckstein et al. |
| 4,494,380 A | 1/1985 | Cross |
| 4,499,329 A | 2/1985 | Benicourt et al. |
| 4,531,379 A | 7/1985 | Diefenthaler, Jr. |
| 4,595,297 A | 6/1986 | Liu et al. |
| 4,634,803 A | 1/1987 | Mathiprakasam |
| 4,651,019 A | 3/1987 | Gilbert et al. |
| 4,730,459 A | 3/1988 | Schlicklin et al. |
| 4,753,682 A | 6/1988 | Cantoni |
| 4,802,929 A | 2/1989 | Schock |
| 4,885,087 A | 12/1989 | Kopf |
| 4,907,060 A | 3/1990 | Nelson et al. |
| 4,989,626 A | 2/1991 | Takagi et al. |
| 5,006,178 A | 4/1991 | Bijvoets |
| 5,038,569 A | 8/1991 | Shirota et al. |
| 5,092,129 A | 3/1992 | Bayes et al. |
| 5,171,372 A | 12/1992 | Recine, Sr. |
| 5,180,293 A | 1/1993 | Hartl |
| 5,193,347 A | 3/1993 | Apisdorf |
| 5,228,923 A | 7/1993 | Hed |
| 5,232,516 A | 8/1993 | Hed |
| 5,254,178 A | 10/1993 | Yamada et al. |
| 5,291,960 A | 3/1994 | Brandenburg et al. |
| 5,316,078 A | 5/1994 | Cesaroni |
| 5,385,020 A | 1/1995 | Gwilliam et al. |
| 5,419,780 A | 5/1995 | Suski |
| 5,419,980 A | 5/1995 | Okamoto et al. |
| 5,429,680 A | 7/1995 | Fuschetti |
| 5,430,322 A | 7/1995 | Koyanagi et al. |
| 5,431,021 A | 7/1995 | Gwilliam et al. |
| 5,456,081 A | 10/1995 | Chrysler et al. |
| 5,497,625 A | 3/1996 | Manz et al. |
| 5,544,487 A | 8/1996 | Attey et al. |
| 5,549,153 A | 8/1996 | Baruschke et al. |
| 5,561,981 A | 10/1996 | Quisenberry et al. |
| 5,563,368 A | 10/1996 | Yamaguchi |
| 5,566,774 A | 10/1996 | Yoshida |
| 5,576,512 A | 11/1996 | Doke |
| 5,584,183 A | 12/1996 | Wright et al. |
| 5,592,363 A | 1/1997 | Atarashi et al. |
| 5,594,609 A | 1/1997 | Lin |
| 5,682,748 A | 11/1997 | DeVilbiss et al. |
| 5,705,770 A | 1/1998 | Ogassawara et al. |
| 5,713,426 A | 2/1998 | Okamura |
| 5,724,818 A | 3/1998 | Iwata et al. |
| 5,822,993 A | 10/1998 | Attey |
| 5,860,472 A | 1/1999 | Batchelder |
| 5,867,990 A | 2/1999 | Ghoshal |
| 5,917,144 A | 6/1999 | Miyake et al. |
| 5,959,341 A | 9/1999 | Tsuno et al. |
| 5,966,941 A | 10/1999 | Ghoshal |
| 5,987,890 A | 11/1999 | Chiu et al. |
| 6,000,225 A | 12/1999 | Ghoshal |
| 6,028,263 A | 2/2000 | Kobayashi et al. |
| 6,050,326 A | 4/2000 | Evans |
| 6,082,445 A | 7/2000 | Dugan |
| 6,084,172 A | 7/2000 | Kishi et al. |
| 6,096,966 A | 8/2000 | Nishimoto et al. |
| 6,127,766 A | 10/2000 | Roidt |
| 6,213,198 B1 | 4/2001 | Shikata et al. |
| 6,223,539 B1 | 5/2001 | Bell |
| 6,226,994 B1 | 5/2001 | Yamada et al. |
| 6,270,015 B1 | 8/2001 | Hirota |
| 6,282,907 B1 | 9/2001 | Ghoshal |
| 6,302,196 B1 | 10/2001 | Haussmann |
| 6,320,280 B1 | 11/2001 | Kanesaka |
| 6,334,311 B1 | 1/2002 | Kim et al. |
| 6,346,668 B1 | 2/2002 | McGrew |
| 6,347,521 B1 | 2/2002 | Kadotani et al. |
| 6,357,518 B1 | 3/2002 | Sugimoto et al. |
| 6,367,261 B1 | 4/2002 | Marshall et al. |
| 6,385,976 B1 | 5/2002 | Yamamura et al. |
| 6,393,842 B2 | 5/2002 | Kim |
| 6,446,442 B1 | 9/2002 | Batchelor et al. |
| 6,474,073 B1 | 11/2002 | Uetsuji et al. |
| 6,477,844 B2 | 11/2002 | Ohkubo et al. |
| 6,499,306 B2 | 12/2002 | Gillen |
| 6,530,231 B1 | 3/2003 | Nagy et al. |
| 6,539,725 B2 | 4/2003 | Bell |
| 6,541,139 B1 | 4/2003 | Cibuzar |
| 6,548,750 B1 | 4/2003 | Picone |
| 6,560,968 B2 | 5/2003 | Ko |
| 6,563,039 B2 | 5/2003 | Caillat et al. |
| RE38,128 E | 6/2003 | Gallup et al. |
| 6,580,025 B2 | 6/2003 | Guy |
| 6,598,403 B1 | 7/2003 | Ghoshal |
| 6,598,405 B2 | 7/2003 | Bell |
| 6,605,773 B2 | 8/2003 | Kok |
| 6,606,866 B2 | 8/2003 | Bell |
| 6,613,972 B2 | 9/2003 | Cohen et al. |
| 6,625,990 B2 | 9/2003 | Bell |

(56) References Cited

U.S. PATENT DOCUMENTS

| | | |
|---|---|---|
| 6,637,210 B2 | 10/2003 | Bell |
| 6,650,968 B2 | 11/2003 | Hallum et al. |
| 6,672,076 B2 | 1/2004 | Bell |
| 6,700,052 B2 | 3/2004 | Bell |
| 6,700,053 B2 | 3/2004 | Hara et al. |
| 6,705,089 B2 | 3/2004 | Chu et al. |
| 6,718,954 B2 | 4/2004 | Ryon |
| 6,779,348 B2 | 8/2004 | Taban |
| 6,787,691 B2 | 9/2004 | Fleurial et al. |
| 6,812,395 B2 | 11/2004 | Bell |
| 6,880,346 B1 | 4/2005 | Tseng et al. |
| 6,886,356 B2 | 5/2005 | Kubo et al. |
| 6,894,215 B2 | 5/2005 | Akiba |
| 6,907,739 B2 | 6/2005 | Bell |
| 6,948,321 B2 | 9/2005 | Bell |
| 6,959,555 B2 | 11/2005 | Bell |
| 6,973,799 B2 | 12/2005 | Kuehl et al. |
| 6,975,060 B2 | 12/2005 | Styblo et al. |
| 6,986,247 B1 | 1/2006 | Parise |
| 7,100,369 B2 | 9/2006 | Yamaguchi et al. |
| 7,111,465 B2 | 9/2006 | Bell |
| 7,134,288 B2 | 11/2006 | Crippen et al. |
| 7,171,955 B2 | 2/2007 | Perkins |
| 7,222,489 B2 | 5/2007 | Pastorino |
| 7,231,772 B2 | 6/2007 | Bell |
| 7,235,735 B2 | 6/2007 | Venkatasubramanian et al. |
| 7,273,981 B2 | 9/2007 | Bell |
| 7,380,586 B2 | 6/2008 | Gawthrop |
| 7,421,845 B2 | 9/2008 | Bell |
| 7,430,875 B2 | 10/2008 | Sasaki et al. |
| 7,475,551 B2 | 1/2009 | Ghoshal |
| 7,523,607 B2 | 4/2009 | Sullivan |
| 7,523,617 B2 | 4/2009 | Venkatasubramanian et al. |
| 7,587,902 B2 | 9/2009 | Bell |
| 7,608,777 B2 | 10/2009 | Bell et al. |
| 7,610,993 B2 | 11/2009 | Sullivan |
| 7,629,530 B2 | 12/2009 | Inaoka |
| 7,788,933 B2 | 9/2010 | Goenka |
| 7,868,242 B2 | 1/2011 | Takahashi et al. |
| 7,870,745 B2 | 1/2011 | Goenka |
| 7,915,516 B2 | 3/2011 | Hu |
| 7,921,640 B2 | 4/2011 | Major |
| 7,926,293 B2 | 4/2011 | Bell |
| 7,932,460 B2 | 4/2011 | Bell |
| 7,942,010 B2 | 5/2011 | Bell |
| 7,946,120 B2 | 5/2011 | Bell |
| 8,039,726 B2 | 10/2011 | Zhang et al. |
| 8,069,674 B2 | 12/2011 | Bell |
| 8,079,223 B2 | 12/2011 | Bell |
| 8,188,359 B2 | 5/2012 | Chakraborty |
| 8,297,049 B2 | 10/2012 | Ohtani |
| 8,327,634 B2 | 12/2012 | Orihashi et al. |
| 8,375,728 B2 | 2/2013 | Bell |
| 8,424,315 B2 | 4/2013 | Goenka |
| 8,445,772 B2 | 5/2013 | Bell et al. |
| 8,459,984 B2 | 6/2013 | Duesel, Jr. et al. |
| 8,495,884 B2 | 7/2013 | Bell et al. |
| 8,540,466 B2 | 9/2013 | Halliar |
| 8,552,284 B2 | 10/2013 | Kanno et al. |
| 8,613,200 B2 | 12/2013 | Lagrandeur et al. |
| 8,614,390 B2 | 12/2013 | Watts |
| 8,640,466 B2 | 2/2014 | Bell et al. |
| 8,646,261 B2 | 2/2014 | Meisner et al. |
| 8,646,262 B2 | 2/2014 | Magnetto |
| 8,656,710 B2 | 2/2014 | Bell et al. |
| 8,658,881 B2 | 2/2014 | Cheng et al. |
| 8,701,422 B2 | 4/2014 | Bell et al. |
| 8,969,704 B2 | 3/2015 | Brück et al. |
| 9,003,784 B2 | 4/2015 | Limbeck et al. |
| 9,006,556 B2 | 4/2015 | Bell et al. |
| 9,006,557 B2 | 4/2015 | LaGrandeur et al. |
| 9,020,572 B2 | 4/2015 | Mensinger et al. |
| 9,105,809 B2 | 8/2015 | Lofy |
| 2001/0029974 A1 | 10/2001 | Cohen et al. |
| 2002/0014261 A1 | 2/2002 | Caillat et al. |
| 2002/0024154 A1 | 2/2002 | Hara et al. |
| 2003/0041892 A1 | 3/2003 | Fleurial et al. |
| 2003/0094265 A1 | 5/2003 | Chu et al. |
| 2003/0106677 A1 | 6/2003 | Memory et al. |
| 2003/0140636 A1 | 7/2003 | Van Winkle |
| 2003/0140957 A1 | 7/2003 | Akiba |
| 2003/0217738 A1 | 11/2003 | Ryon |
| 2003/0223919 A1 | 12/2003 | Kwak et al. |
| 2004/0025516 A1 | 2/2004 | Van Winkle |
| 2004/0045594 A1 | 3/2004 | Hightower |
| 2004/0076214 A1 | 4/2004 | Bell et al. |
| 2004/0089336 A1 | 5/2004 | Hunt |
| 2004/0177876 A1 | 9/2004 | Hightower |
| 2004/0221577 A1 | 11/2004 | Yamaguchi et al. |
| 2004/0261831 A1 | 12/2004 | Hightower |
| 2004/0267408 A1 | 12/2004 | Kramer |
| 2005/0074646 A1 | 4/2005 | Rajashekara et al. |
| 2005/0105224 A1 | 5/2005 | Nishi |
| 2005/0121065 A1 | 6/2005 | Otey |
| 2005/0139692 A1 | 6/2005 | Yamamoto |
| 2005/0172993 A1 | 8/2005 | Shimoji et al. |
| 2005/0194034 A1 | 9/2005 | Yamaguchi et al. |
| 2005/0217714 A1 | 10/2005 | Nishijima et al. |
| 2005/0263176 A1 | 12/2005 | Yamaguchi et al. |
| 2006/0005548 A1 | 1/2006 | Ruckstuhl |
| 2006/0005873 A1 | 1/2006 | Kambe et al. |
| 2006/0080979 A1 | 4/2006 | Kitanovski et al. |
| 2006/0086118 A1 | 4/2006 | Venkatasubramanian et al. |
| 2006/0118159 A1 | 6/2006 | Tsuneoka et al. |
| 2006/0124165 A1 | 6/2006 | Bierschenk et al. |
| 2006/0130888 A1 | 6/2006 | Yamaguchi et al. |
| 2006/0157102 A1 | 7/2006 | Nakajima et al. |
| 2006/0168969 A1 | 8/2006 | Mei et al. |
| 2006/0174633 A1 | 8/2006 | Beckley |
| 2006/0179820 A1 | 8/2006 | Sullivan |
| 2006/0219281 A1 | 10/2006 | Kuroyanagi et al. |
| 2006/0240369 A1 | 10/2006 | Duesel, Jr. et al. |
| 2006/0254284 A1 | 11/2006 | Ito et al. |
| 2007/0000255 A1 | 1/2007 | Elliot et al. |
| 2007/0045044 A1 | 3/2007 | Sullivan |
| 2007/0125413 A1 | 6/2007 | Olsen et al. |
| 2007/0193617 A1 | 8/2007 | Taguchi |
| 2007/0220902 A1 | 9/2007 | Matsuoka et al. |
| 2007/0261729 A1 | 11/2007 | Hu |
| 2007/0272290 A1 | 11/2007 | Sims et al. |
| 2008/0035195 A1 | 2/2008 | Bell |
| 2008/0083445 A1 | 4/2008 | Chakraborty |
| 2008/0090137 A1 | 4/2008 | Buck et al. |
| 2008/0115818 A1 | 5/2008 | Cheng et al. |
| 2008/0283110 A1 | 11/2008 | Jin et al. |
| 2008/0289677 A1 | 11/2008 | Bell |
| 2009/0000310 A1 | 1/2009 | Bell et al. |
| 2009/0007952 A1 | 1/2009 | Kondoh et al. |
| 2009/0038302 A1 | 2/2009 | Yamada et al. |
| 2009/0133734 A1 | 5/2009 | Takahashi et al. |
| 2009/0151342 A1 | 6/2009 | Major |
| 2009/0293499 A1 | 12/2009 | Bell et al. |
| 2009/0301103 A1 | 12/2009 | Bell et al. |
| 2009/0301539 A1 | 12/2009 | Watts |
| 2010/0024859 A1 | 2/2010 | Bell et al. |
| 2010/0031987 A1 | 2/2010 | Bell |
| 2010/0052374 A1 | 3/2010 | Bell et al. |
| 2010/0095996 A1 | 4/2010 | Bell |
| 2010/0101238 A1 | 4/2010 | LaGrandeur et al. |
| 2010/0101239 A1 | 4/2010 | LaGrandeur et al. |
| 2010/0186399 A1 | 7/2010 | Huttinger |
| 2010/0236595 A1 | 9/2010 | Bell |
| 2010/0326092 A1 | 12/2010 | Goenka |
| 2010/0331657 A1 | 12/2010 | Mensinger et al. |
| 2011/0005562 A1* | 1/2011 | Bisges ............ 136/206 |
| 2011/0067742 A1* | 3/2011 | Bell et al. ............ 136/204 |
| 2011/0185715 A1 | 8/2011 | Limbeck et al. |
| 2011/0209740 A1 | 9/2011 | Bell et al. |
| 2011/0244300 A1 | 10/2011 | Closek et al. |
| 2011/0247668 A1 | 10/2011 | Bell et al. |
| 2011/0258995 A1 | 10/2011 | Limbeck et al. |
| 2011/0271994 A1 | 11/2011 | Gilley |
| 2011/0308771 A1 | 12/2011 | Heckenberger et al. |
| 2012/0060775 A1 | 3/2012 | Aixala |

(56) References Cited

U.S. PATENT DOCUMENTS

| | | |
|---|---|---|
| 2012/0073276 A1 | 3/2012 | Meisner et al. |
| 2012/0102934 A1 | 5/2012 | Magnetto |
| 2012/0111386 A1 | 5/2012 | Bell et al. |
| 2012/0174567 A1 | 7/2012 | Limbeck et al. |
| 2012/0174568 A1 | 7/2012 | Bruck et al. |
| 2012/0177864 A1 | 7/2012 | Limbeck et al. |
| 2012/0266608 A1 | 10/2012 | Kadle et al. |
| 2012/0305043 A1 | 12/2012 | Kossakovski et al. |
| 2013/0037073 A1 | 2/2013 | LaGrandeur et al. |
| 2013/0068273 A1 | 3/2013 | Kanno et al. |
| 2013/0104953 A1 | 5/2013 | Poliquin et al. |
| 2013/0160809 A1 | 6/2013 | Mueller |
| 2013/0167894 A1 | 7/2013 | Brueck et al. |
| 2013/0186448 A1 | 7/2013 | Ranalli et al. |
| 2013/0255739 A1 | 10/2013 | Kossakovski et al. |
| 2013/0276849 A1 | 10/2013 | Kossakovski et al. |
| 2013/0327368 A1 | 12/2013 | Crane |
| 2013/0327369 A1 | 12/2013 | Jovovic et al. |
| 2013/0340802 A1 | 12/2013 | Jovovic et al. |
| 2014/0034102 A1 | 2/2014 | Ranalli et al. |
| 2014/0096807 A1 | 4/2014 | Ranalli |
| 2014/0190185 A1 | 7/2014 | Bell et al. |
| 2014/0224291 A1 | 8/2014 | Bell |
| 2014/0325997 A1 | 11/2014 | Bell |
| 2015/0176872 A1 | 6/2015 | Goenka |
| 2015/0194590 A1 | 7/2015 | LaGrandeur |

FOREIGN PATENT DOCUMENTS

| | | |
|---|---|---|
| CN | 1295345 A | 5/2001 |
| CN | 1343294 A | 4/2002 |
| CN | ZL 200510068776.8 | 5/2010 |
| DE | 43 29 816 A1 | 3/1994 |
| DE | 10 2008 063701 A1 | 6/2010 |
| DE | 10 2009 003 737 | 10/2010 |
| DE | 10 2010 012 629 | 9/2011 |
| DE | 10 2010 035 152 A1 | 2/2012 |
| EP | 0 272 937 A2 | 6/1988 |
| EP | 0 878 851 A2 | 11/1998 |
| EP | 1 174 996 | 1/2002 |
| EP | 1 475 532 A | 11/2004 |
| EP | 1 515 376 | 3/2005 |
| EP | 1 679 480 A | 7/2006 |
| EP | 1 780 807 A1 | 5/2007 |
| EP | 2 159 854 A1 | 3/2010 |
| EP | 2 180 534 A1 | 4/2010 |
| EP | 2 275 755 A2 | 1/2011 |
| EP | 1 906 463 A3 | 3/2011 |
| EP | 2 378 577 A2 | 10/2011 |
| EP | 2 381 083 A1 | 10/2011 |
| EP | 2 439 799 A1 | 4/2012 |
| EP | 2 541 634 A1 | 1/2013 |
| EP | 2 313 938 B1 | 10/2013 |
| FR | 1 280 711 A | 1/1962 |
| FR | 2 261 638 A | 9/1975 |
| FR | 2 316 557 A1 | 1/1977 |
| FR | 2 419 479 A | 10/1979 |
| FR | 2 481 786 A1 | 11/1981 |
| FR | 2543275 | 9/1984 |
| FR | 2 512 499 | 10/1984 |
| FR | 2 550 324 A | 2/1985 |
| FR | 2 806 666 A1 | 9/2001 |
| FR | 2 879 728 | 6/2006 |
| GB | 231 192 A | 5/1926 |
| GB | 817 077 A | 7/1959 |
| GB | 952 678 | 3/1964 |
| GB | 1151947 | 5/1969 |
| GB | 2 027 534 | 2/1980 |
| GB | 2 267 338 A | 12/1993 |
| GB | 2 333 352 A | 7/1999 |
| JP | 45-008280 | 3/1970 |
| JP | 59097457 | 6/1984 |
| JP | 60-80044 | 7/1985 |
| JP | 63-262076 A | 10/1988 |
| JP | 01-131830 A | 5/1989 |
| JP | 01-200122 | 8/1989 |
| JP | 03-102219 A2 | 10/1991 |
| JP | 03-263382 | 11/1991 |
| JP | 04-165234 | 6/1992 |
| JP | 05-195765 | 8/1993 |
| JP | 5-219765 | 8/1993 |
| JP | 06-038560 | 2/1994 |
| JP | 06-089955 | 3/1994 |
| JP | 6-342940 | 12/1994 |
| JP | 7-198284 | 1/1995 |
| JP | A-7-7187 | 1/1995 |
| JP | 07-074397 | 3/1995 |
| JP | H07 111344 | 4/1995 |
| JP | 09-321355 | 5/1995 |
| JP | 7 156645 | 6/1995 |
| JP | A-7-202275 | 8/1995 |
| JP | 07-253264 | 2/1996 |
| JP | 08-037322 A | 2/1996 |
| JP | 08-098569 | 4/1996 |
| JP | 08-222771 | 8/1996 |
| JP | A-8-293627 | 11/1996 |
| JP | 09-042801 | 2/1997 |
| JP | 9-089284 A | 4/1997 |
| JP | 09-275692 | 10/1997 |
| JP | 09-276076 | 10/1997 |
| JP | H 09-276076 | 10/1997 |
| JP | 10 012935 | 1/1998 |
| JP | 10-035268 | 2/1998 |
| JP | 10 163538 | 6/1998 |
| JP | H10-325561 | 8/1998 |
| JP | 10238406 A | 9/1998 |
| JP | 10-275943 | 10/1998 |
| JP | 10290590 | 10/1998 |
| JP | 11-317481 | 11/1998 |
| JP | 11-032492 | 2/1999 |
| JP | 11 046021 | 2/1999 |
| JP | 11-182907 | 7/1999 |
| JP | 11-201475 A | 7/1999 |
| JP | 11-274574 | 10/1999 |
| JP | 11-274575 | 10/1999 |
| JP | 11-041959 | 12/1999 |
| JP | 2000 018095 | 1/2000 |
| JP | H2000-58930 | 2/2000 |
| JP | 2000-208823 | 7/2000 |
| JP | 2002-21534 | 7/2000 |
| JP | H2000-214934 | 8/2000 |
| JP | 2000-274788 | 10/2000 |
| JP | 2000-274871 A | 10/2000 |
| JP | 2000-274874 | 10/2000 |
| JP | 2000 286469 A | 10/2000 |
| JP | 2000 323759 | 11/2000 |
| JP | 01 007263 A | 1/2001 |
| JP | 2001-24240 | 1/2001 |
| JP | 2001 210879 | 8/2001 |
| JP | 2001-267642 A | 9/2001 |
| JP | 2001304778 | 10/2001 |
| JP | 2001-336853 | 1/2002 |
| JP | 2002-13758 | 1/2002 |
| JP | 2002-059736 A | 2/2002 |
| JP | 2002 111078 | 4/2002 |
| JP | 2002 199761 | 7/2002 |
| JP | 2002 232028 A | 8/2002 |
| JP | 2002 325470 | 11/2002 |
| JP | 2003 86223 | 3/2003 |
| JP | 2003 175720 A | 6/2003 |
| JP | 2003 259671 | 9/2003 |
| JP | 2003 332642 | 11/2003 |
| JP | 2004 079883 | 3/2004 |
| JP | 2004-332596 | 11/2004 |
| JP | 2004 343898 | 12/2004 |
| JP | 2004 360522 | 12/2004 |
| JP | 2004-360681 | 12/2004 |
| JP | 2005-151661 A | 6/2005 |
| JP | 2005 212564 | 8/2005 |
| JP | 2005-299417 | 10/2005 |
| JP | 2005 317648 | 11/2005 |
| JP | 2006 214350 | 8/2006 |
| JP | 2006-250524 | 9/2006 |

(56) References Cited

FOREIGN PATENT DOCUMENTS

| | | |
|---|---|---|
| JP | 2008 042994 | 2/2008 |
| JP | 2008 274790 | 11/2008 |
| JP | 2008 300465 | 12/2008 |
| JP | 2008-546954 | 12/2008 |
| JP | 2009-010138 A | 1/2009 |
| JP | 2009 033806 | 2/2009 |
| JP | 2012-522176 | 9/2012 |
| JP | 2013-500590 | 1/2013 |
| LU | 66619 | 2/1973 |
| RU | 2 099 642 C1 | 12/1997 |
| RU | 2 142 178 | 11/1999 |
| RU | 2 154 875 C2 | 8/2000 |
| RU | 2 174 475 | 10/2001 |
| RU | 2174475 | 10/2001 |
| SE | 329 870 | 10/1970 |
| SE | 337 227 | 5/1971 |
| SU | 184886 A | 7/1966 |
| SU | 1142711 A | 2/1985 |
| SU | 1170234 A | 7/1985 |
| WO | WO 95/20721 | 8/1995 |
| WO | WO 9722486 A1 | 6/1997 |
| WO | WO 97/47930 | 12/1997 |
| WO | WO 98/034451 | 10/1998 |
| WO | WO 98/50686 | 11/1998 |
| WO | WO 98/56047 A1 | 12/1998 |
| WO | WO 99/10191 | 3/1999 |
| WO | WO 01/52332 | 7/2001 |
| WO | WO 02/065029 | 8/2002 |
| WO | WO 02/065030 | 8/2002 |
| WO | WO 02/081982 | 10/2002 |
| WO | WO 03/074951 A1 | 9/2003 |
| WO | WO 03/090286 | 10/2003 |
| WO | WO 03/104726 A1 | 12/2003 |
| WO | WO 2004/019379 A | 3/2004 |
| WO | WO 2004/026757 | 4/2004 |
| WO | WO 2004/059139 | 7/2004 |
| WO | WO 2004/092662 | 10/2004 |
| WO | WO 2005/020422 | 3/2005 |
| WO | WO 2005/023571 | 3/2005 |
| WO | WO 2005/098225 A | 10/2005 |
| WO | WO 2006/001827 | 1/2006 |
| WO | WO 2006/037178 A | 4/2006 |
| WO | WO 2006/064432 | 6/2006 |
| WO | WO 2007/001289 | 1/2007 |
| WO | WO 2007/002891 | 1/2007 |
| WO | WO 2007/109368 | 9/2007 |
| WO | WO 2008/013946 A2 | 1/2008 |
| WO | WO 2008/042077 | 4/2008 |
| WO | WO 2008/091293 A2 | 7/2008 |
| WO | WO 2008/123330 | 10/2008 |
| WO | WO 2010/135173 | 11/2010 |
| WO | WO 2012/022684 | 2/2012 |
| WO | WO 2012/031980 A3 | 3/2012 |
| WO | WO 2012/045542 A3 | 4/2012 |
| WO | WO 2012/170443 | 12/2012 |
| WO | WO 2014/055447 | 4/2014 |
| WO | WO 2014/022428 | 5/2014 |

OTHER PUBLICATIONS

Derwent-Acc-No. 1998-283540, Kwon, H et al., Hyundai Motor Co., corresponding to KR 97026106 A, published Jun. 24, 1997 (2 pages).
Diller, R. W., et al.: "Experimental results confirming improved performance of systems using thermal isolation" Thermoelectrics, 2002. Proceedings ICT '02. Twenty-First International Conference on Aug. 25-29, 2002, Piscataway, NJ USA, IEEE, Aug. 25, 2002, pp. 548-550, XP010637541 ISBN: 0-7803-7683-8.
Diller, R.W., et al., "Experimental Results Confirming Improved Efficiency of Thermoelectric Power Generation Systems with Alternate Thermodynamic Cycles," 22nd International Conference on Thermoelectrics, 2003, pp. 571-573.
Fleurial, et al., "Development of Segmented Thermoelectric Multicopule Converter Technology," Aerospace Conference, 2006 IEEE Big Sky, Mt., Mar. 4-11, 2006, pp. 1-10.
Funahashi et al., "A portable thermoelectric-power-generating module composed of oxide devices," Journal of Applied Physics 99, 066117 (2006).
Funahashi et al., "Preparation and properties of thermoelectric pipe-type modules", ICT 25th International Conference on Aug. 6-10, 2006, Thermoelectrics, 2006, pp. 58-61.
Hendricks, Terry et al., "Advanced Thermoelectric Power System Investigations for Light-Duty and Heavy Duty Applications," National Renewable Energy Laboratory, Center for Transportation Technology & Systems, Colorado, 2002.
Min et al., "Ring-structured thermoelectric module", Semiconductor Science and Technology, Aug. 2007, vol. 22, No. 8, pp. 880-888.
Miner, A., et al. "Thermo-Electro-Mechanical Refrigeration Based on Transient Thermoelectric Effects", Applied Physics letters, vol. 75, pp. 1176-1178 (1999).
Snyder, G. Jeffrey, et al., "Thermoelectric Efficiency and Compatibility," The American Physical Society, Oct. 2, 2003, vol. 91, No. 14.
Snyder, G. Jeffrey: "Application of the compatibility factor to the design of segmented and cascaded thermoelectric generators" Applied Physics Letters, AIP, American Institute of Physics, Melville, NY, vol. 84, No. 13, Mar. 29, 2004, pp. 2436-2438, XPO12060957 ISSN: 0003-6951.
Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).
Thermoelectrics Handbook: Macro to Nano, 2006, Chpt. 11, Section 11.7, pp. 11-11 to 11-15, CRC Press, Boca Raton, FL.
Ursell, T.S. et al., "Compatibility of Segmented Thermoelectric Generators," 21st International Conference on Thermoelectronics, 2002, p. 412-417.
International Preliminary Report on Patentability for PCT/US2013/052776, mailed Dec. 3, 2014.
U.S. Appl. No. 14/109,783, filed Dec. 17, 2013, Bell, Lon et al.
U.S. Appl. No. 14/152,741, filed Jan. 10, 2014, LaGrandeur, John et al.
International Search Report and Written Opinion dated Dec. 16, 2013, Application No. PCT/US2013/022299, filed Jan. 18, 2013 in 15 pages.
International Search Report and Written Opinion re Application No. PCT/US2013/052776, mailed Mar. 17, 2014.
International Search Report with Written Opinion dated Mar. 17, 2010, Application No. PCT/US2009/046166, filed Jun. 3, 2009.
Supplementary International Written Opinion re Application No. PCT/US2013/052776, mailed Aug. 27, 2014.
U.S. Appl. No. 14/760,680, filed Jul. 13, 2015, Piggott et al.
Ikoma, K., et al., "Thermoelectric Module and Generator for Gasoline Engine Vehicles," 17th Int'l Conf. on Thermo-electrics, Nagoya, Japan, pp. 464-467 (1998).
Kambe et al., "Encapsulated Thermoelectric Modules and Compliant Pads for Advanced Thermoelectric Systems," J. Electronic Materials, vol. 39, No. 9, 1418-21 (2010).
Lofy, John et al., "Thermoelectrics for Environmental Control Automobiles," 21st International Conference on Thermoelectronics, 2002, p. 471-476.
Menchen, et al., "Thermoelectric Conversion to Recover Heavy Duty Diesel Exhaust Energy", Proceedings of the Annual Automotive Technology Development Contractors Meeting, pp. 445-449, Apr. 1991.
English Translation of Notice of Reasons for Rejection for Japanese Patent Application No. 2015-525520 mailed Feb. 2, 2016.

* cited by examiner

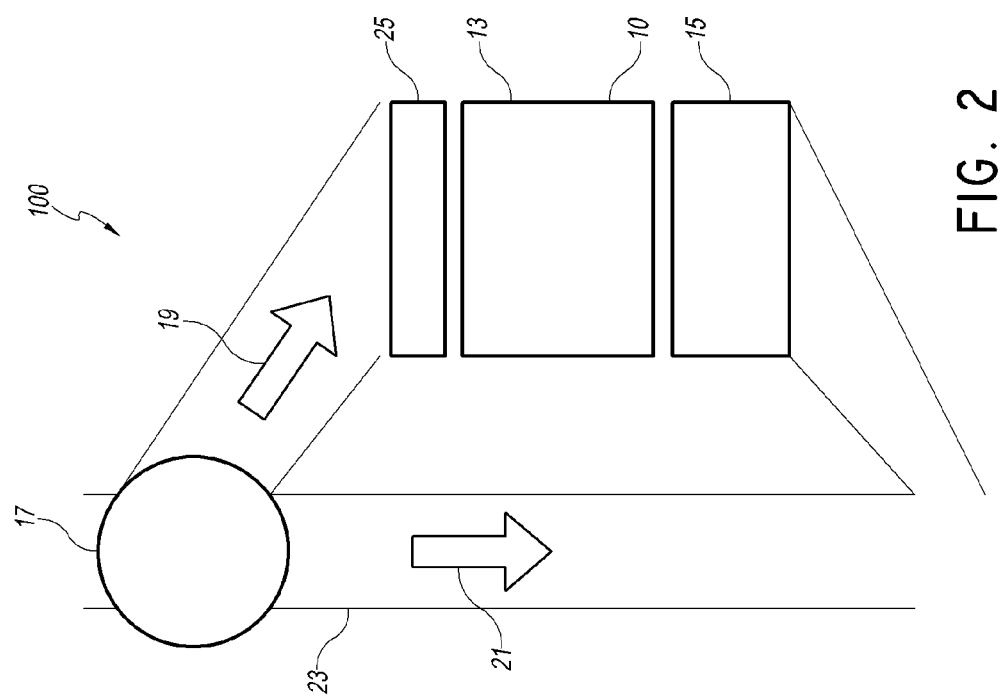

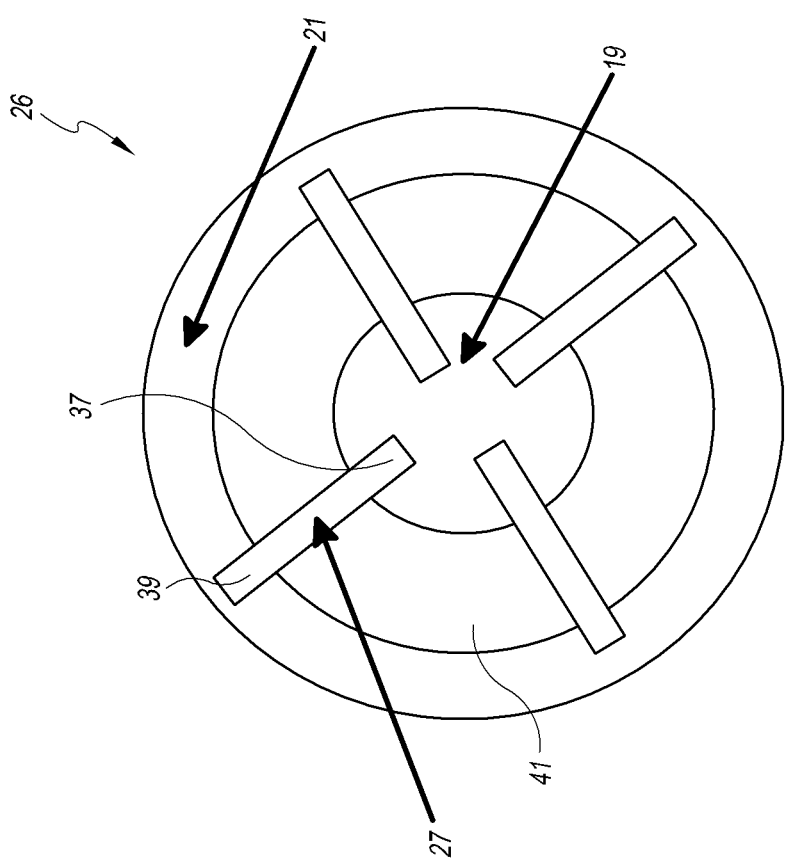

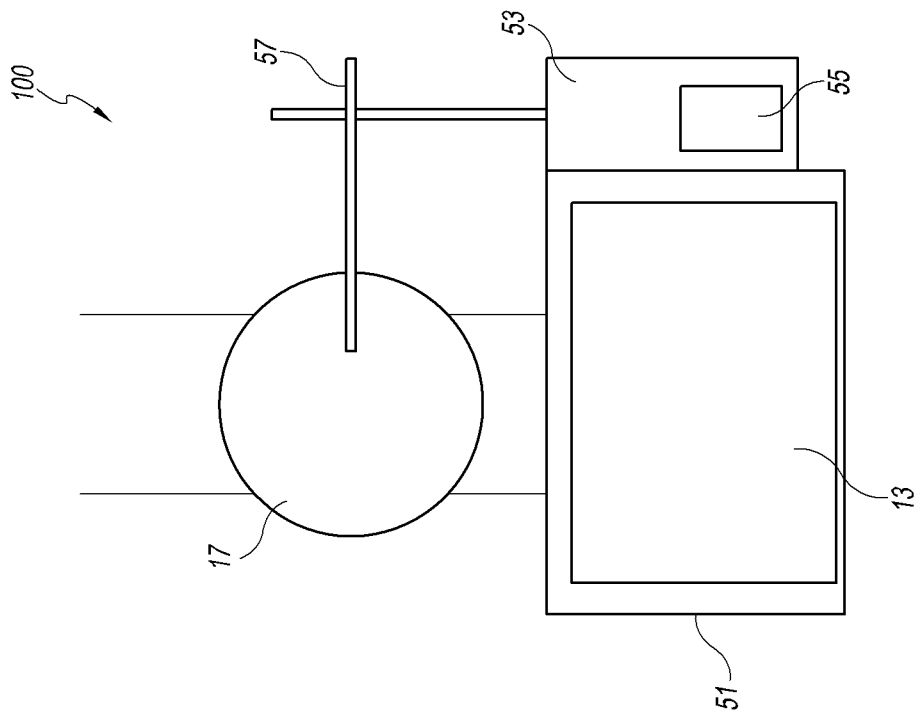
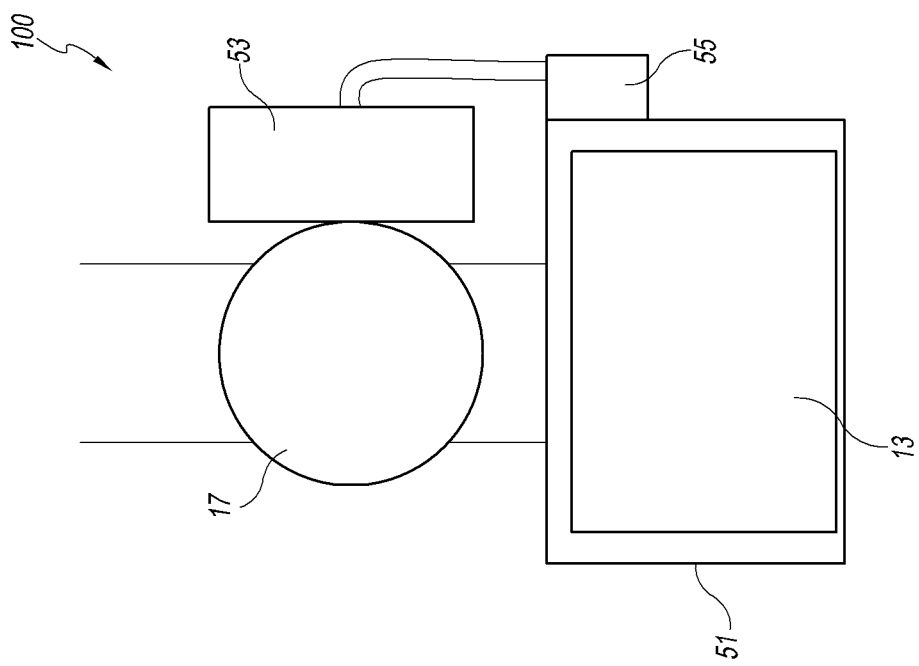

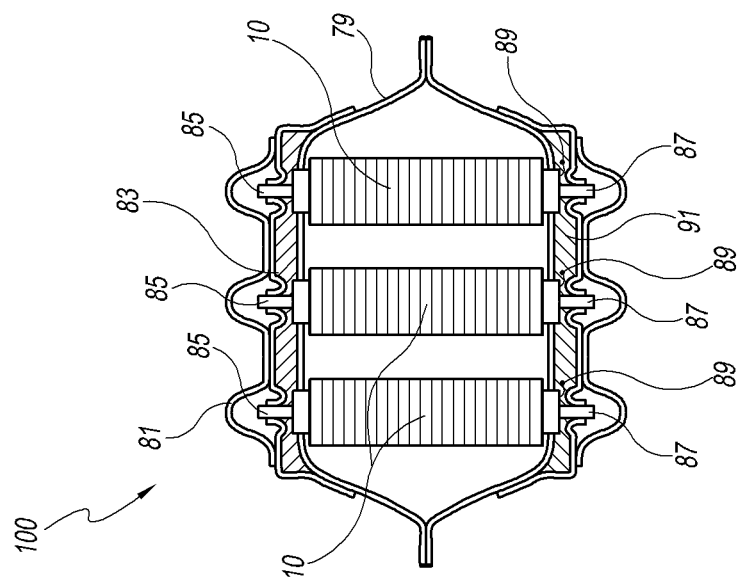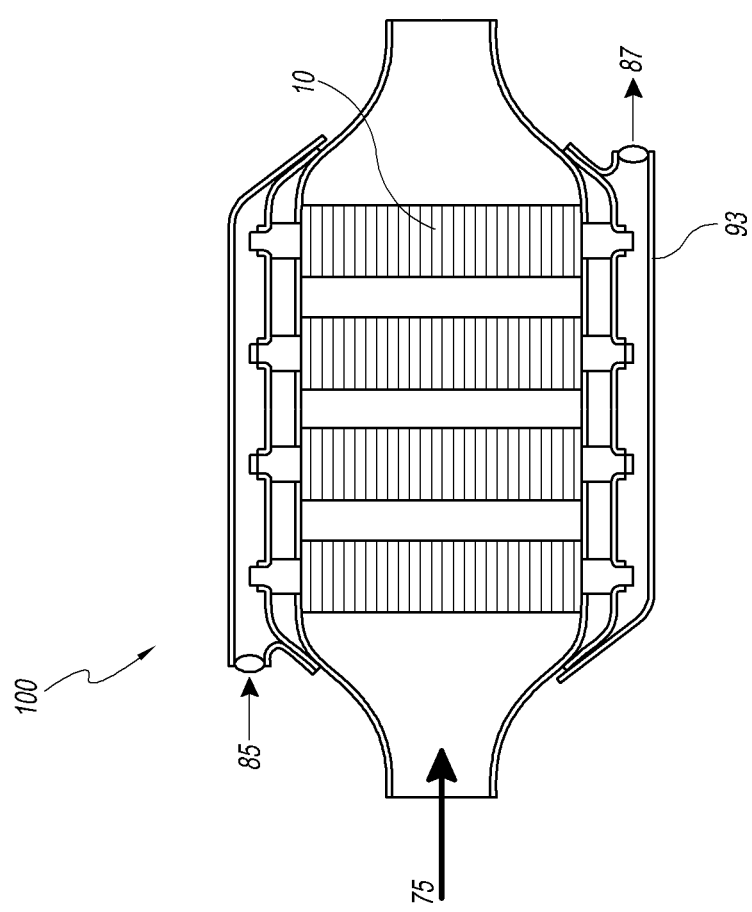
FIG. 9B

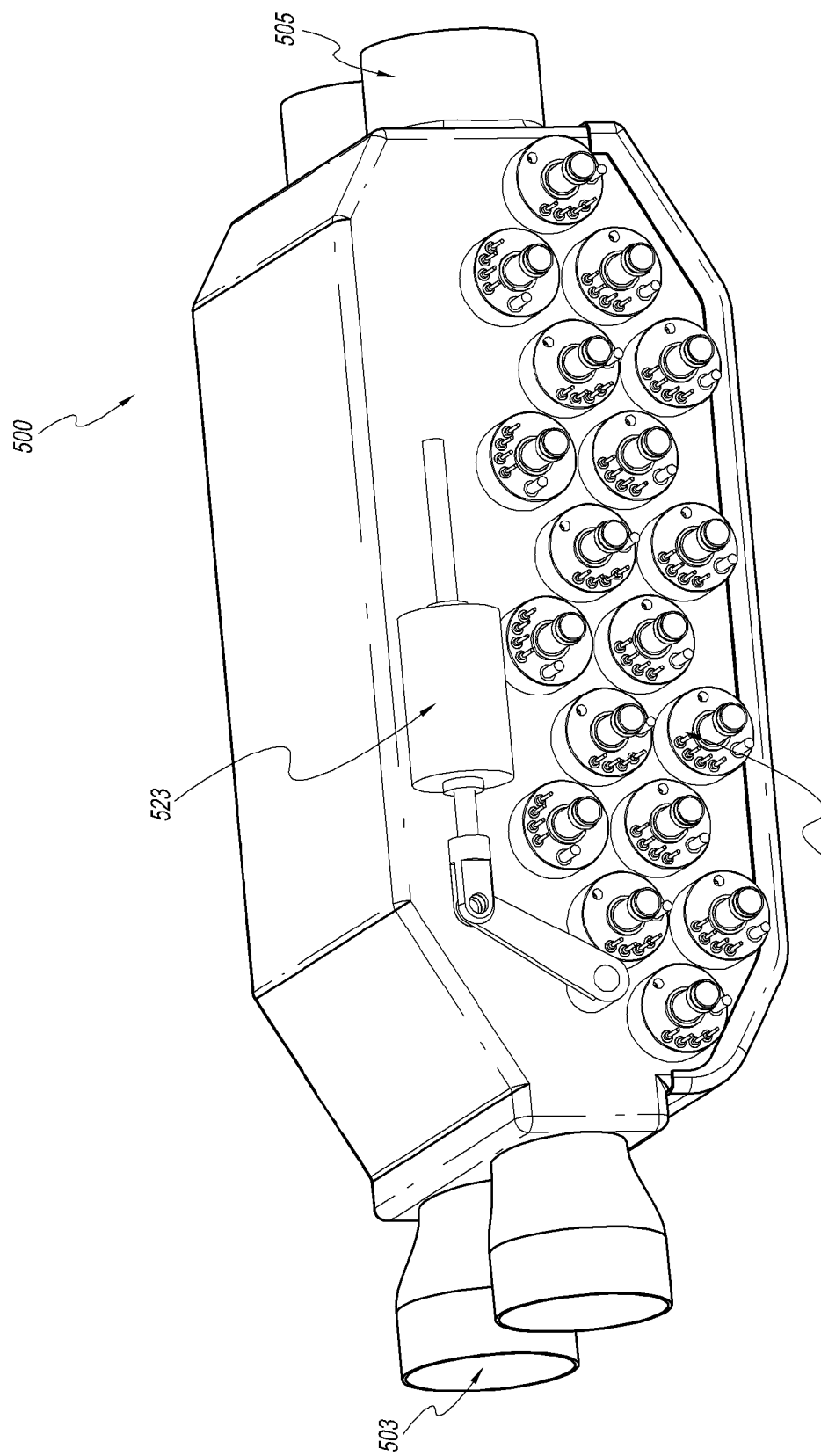

HIGH EFFICIENCY THERMOELECTRIC GENERATION

RELATED APPLICATIONS

This application claims the benefit of U.S. Provisional Application No. 61/678,511, filed Aug. 1, 2012 and U.S. Provisional Application No. 61/678,975, filed Aug. 2, 2012. The entire contents of each of the applications identified above are incorporated by reference herein and made a part of this specification.

BACKGROUND

1. Field

The present application relates generally to thermoelectric cooling, heating, and power generation systems.

2. Description of Related Art

Thermoelectric (TE) devices and systems can be operated in either heating/cooling or power generation modes. In the former, electric current is passed through a TE device to pump the heat from the cold side to the hot side. In the latter, a heat flux driven by a temperature gradient across a TE device is converted into electricity. In both modalities, the performance of the TE device is largely determined by the figure of merit of the TE material and by the parasitic (dissipative) losses throughout the system. Working elements in the TE device are typically p-type and n-type semiconducting materials.

SUMMARY

In certain embodiments, a thermoelectric power generating system is provided comprising at least one thermoelectric assembly. The at least one thermoelectric assembly comprises at least one first heat exchanger in thermal communication with at least a first portion of a first working fluid. The first portion of the first working fluid flows through the at least one thermoelectric assembly. The at least one thermoelectric assembly further comprises a plurality of thermoelectric elements in thermal communication with the at least one first heat exchanger. The at least one thermoelectric assembly further comprises at least one second heat exchanger in thermal communication with the plurality of thermoelectric elements and with a second working fluid flowing through the at least one thermoelectric assembly. The second working fluid is cooler than the first working fluid. The thermoelectric power generating system further comprises at least one heat exchanger portion configured to have at least some of the first portion of the first working fluid flow through the at least one heat exchanger portion after having flowed through the at least one thermoelectric assembly. The at least one heat exchanger portion is configured to recover heat from the at least some of the first portion of the first working fluid.

In some embodiments, the at least one heat exchanger portion can comprise a first conduit through which the at least some of the first portion of the first working fluid flows. The at least one heat exchanger portion can further comprise a second conduit through which at least a portion of the second working fluid flows. The second conduit is in thermal communication with the first conduit such that the portion of the second working fluid receives heat from the at least some of the first portion of the first working fluid.

In some embodiments, the at least one thermoelectric assembly is configured to convert high-temperature heat of the first working fluid to electricity such that low-temperature heat of the first working fluid is received by the at least one heat exchanger portion.

In some embodiments, the thermoelectric power generating system can comprise at least one bypass conduit. The thermoelectric power generating system further comprises at least one valve configured to selectively allow at least the first portion of the first working fluid to flow through the at least one first heat exchanger and to selectively allow at least a second portion of the first working fluid to flow through the bypass conduit.

In some embodiments, the at least one heat exchanger portion is configured to receive at least some of the second portion of the first working fluid after having flowed through the at least one bypass conduit and to recover heat from the at least some of the second portion of the first working fluid.

In some embodiments, the at least one valve can comprise a proportional valve.

In some embodiments, the at least one valve can comprise at least one component that is sensitive to high temperatures, and the at least one component is in thermal communication with the second working fluid.

In some embodiments, the first working fluid can comprise exhaust gas from an engine. The at least one heat exchanger portion is further configured to use the recovered heat to warm at least one of an engine block of the engine and a catalytic converter of the engine.

In some embodiments, the thermoelectric power generating system can further comprise at least one second heat exchanger portion configured to have at least the first portion of the first working fluid flow through the at least one second heat exchanger portion prior to flowing through the at least one thermoelectric assembly. The at least one second heat exchanger portion is configured to reduce a temperature of the first portion of the first working fluid.

In some embodiments, the first working fluid can comprise exhaust gas from an engine. The at least one thermoelectric assembly is integrated into at least one muffler of the engine.

In certain embodiments, a method of generating electricity is provided comprising receiving at least a first portion of a first working fluid. The method further comprises flowing the first portion of the first working fluid through at least one thermoelectric assembly and converting at least some heat from the first portion of the first working fluid to electricity. The method further comprises receiving at least some of the first portion of the first working fluid after having flowed through the at least one thermoelectric assembly. The method further comprises recovering at least some heat from the at least some of the first portion of the first working fluid.

In some embodiments, converting at least some heat from the first portion of the first working fluid to electricity can comprise converting high-temperature heat from the first working fluid to electricity. Recovering at least some heat from the at least some of the first portion of the first working fluid can comprise recovering low-temperature heat of the first working fluid.

In some embodiments, the method can further comprise selectively allowing at least the first portion of the first working fluid to flow through the at least one thermoelectric assembly and selectively allowing at least a second portion of the first working fluid to not flow through the at least one thermoelectric assembly.

In some embodiments, the first working fluid can comprise an exhaust gas from an engine. The method further comprises using the recovered heat to warm at least one of an engine block of the engine and a catalytic converter of the engine.

In some embodiments, the method can further comprise reducing a temperature of the first portion of the first working fluid prior to flowing through the at least one thermoelectric assembly.

In certain embodiments, a thermoelectric power generation system is provided comprising at least one thermoelectric assembly and a first flow path with a first flow resistance. The first flow path through the at least one thermoelectric assembly. The system further comprises a second flow path with a second flow resistance lower than the first flow resistance. The second flow path bypasses the at least one thermoelectric assembly. The system further comprises at least one valve configured to vary a first amount of a working fluid flowing along the first flow path and a second amount of the working fluid flowing along the second flow path.

In some embodiments, the system can further comprise at least one conduit comprising at least one wall portion having a plurality of perforations. The first flow path extends through the plurality of perforations.

In some embodiments, the at least one conduit can further comprises an inlet and an outlet. The at least one valve is between the inlet and the outlet.

In some embodiments, the at least one wall portion can further comprise a first wall portion with a first plurality of perforations and a second wall portion with a second plurality of perforations. The at least one valve between the first wall portion and the second wall portion. The first flow path extends through the first plurality of perforations outwardly from the at least one conduit and through the second plurality of perforations inwardly to the at least one conduit. The second flow path does not extend through the first plurality of perforations and not through the second plurality of perforations.

In some embodiments, the at least one valve can comprise a proportional valve. In some embodiments, the at least one valve can comprise a flap valve.

In some embodiments, the at least one thermoelectric assembly is integrated in a muffler of an engine exhaust system.

In certain embodiments, a method of generating electricity is provided comprising receiving a working fluid and selectively flowing at least a portion of the working fluid either along a first flow path having a first flow resistance or along a second flow path having a second flow resistance lower than the first flow resistance. The first flow path extends through at least one thermoelectric assembly. The second flow path does not extend through the at least one thermoelectric assembly.

In some embodiments, the first flow path extends through a plurality of perforations of at least one wall portion of at least one conduit.

In some embodiments, the at least one wall portion can further comprise a first wall portion with a first plurality of perforations and a second wall portion with a second plurality of perforations. The first flow path extends through the first plurality of perforations outwardly from the at least one conduit and through the second plurality of perforations inwardly to the at least one conduit.

The paragraphs above recite various features and configurations of one or more of a thermoelectric assembly, a thermoelectric module, or a thermoelectric system, that have been contemplated by the inventors. It is to be understood that the inventors have also contemplated thermoelectric assemblies, thermoelectric modules, and thermoelectric systems which comprise combinations of these features and configurations from the above paragraphs, as well as thermoelectric assemblies, thermoelectric modules, and thermoelectric systems which comprise combinations of these features and configurations from the above paragraphs with other features and configurations disclosed in the following paragraphs.

BRIEF DESCRIPTION OF THE DRAWINGS

Various embodiments are depicted in the accompanying drawings for illustrative purposes, and should in no way be interpreted as limiting the scope of the thermoelectric assemblies or systems described herein. In addition, various features of different disclosed embodiments can be combined with one another to form additional embodiments, which are part of this disclosure. Any feature or structure can be removed, altered, or omitted. Throughout the drawings, reference numbers may be reused to indicate correspondence between reference elements.

FIG. 2 schematically illustrates an example thermoelectric power generating system with a pre-heat exchanger portion.

FIG. 4 schematically illustrates a cross-sectional view of an example heat exchanger portion.

FIGS. 5A-5B schematically illustrate two example thermoelectric power generating systems.

FIG. 9B schematically illustrates an example thermoelectric power generating system having a coolant routing integrated into a multiple-shell muffler.

FIGS. 15A-15B schematically illustrate some internal features an example thermoelectric power generating system.

DETAILED DESCRIPTION

Figure 1B:
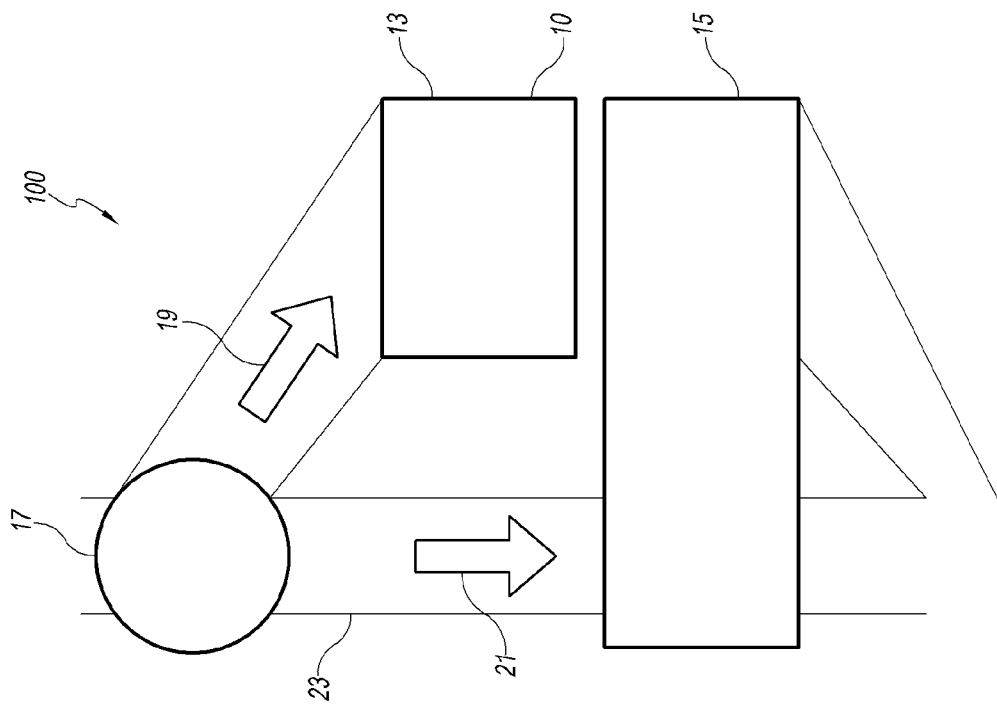
FIG. 1B schematically illustrates an example thermoelectric power generating system with a heat exchanger portion engaged to a bypass conduit.

Although certain embodiments and examples are disclosed herein, the subject matter extends beyond the examples in the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

A thermoelectric system as described herein comprise a thermoelectric generator (TEG) which uses the temperature difference between two fluids, two solids (e.g., rods), or a solid and a fluid to produce electrical power via thermoelectric materials. Alternatively, a thermoelectric system as described herein can comprise a heater, cooler, or both which serves as a solid state heat pump used to move heat from one surface to another, thereby creating a temperature difference between the two surfaces via the thermoelectric materials. Each of the surfaces can be in thermal communication with or comprise a solid, a liquid, a gas, or a combination of two or more of a solid, a liquid, and a gas, and the two surfaces can both be in thermal communication with a solid, both be in thermal communication with a liquid, both be in thermal communication with a gas, or one can be in thermal communication with a material selected from a solid, a liquid, and a gas, and the other can be in thermal communication with a material selected from the other two of a solid, a liquid, and a gas.

The thermoelectric system can include a single thermoelectric assembly (e.g., a single TE cartridge) or a group of thermoelectric assemblies (e.g., a group of TE cartridges), depending on usage, power output, heating/cooling capacity, coefficient of performance (COP) or voltage. Although the examples described herein may be described in connection with either a power generator or a heating/cooling system, the described features can be utilized with either a power generator or a heating/cooling system. Examples of TE cartridges compatible with certain embodiments described herein are provided by U.S. Pat. Appl. Publ. No. 2013/0104953, filed Jun. 5, 2012 and U.S. patent application Ser. No. 13/794,453, filed Mar. 11, 2013, each of which is incorporated in its entirety by reference herein.

The term "thermal communication" is used herein in its broad and ordinary sense, describing two or more components that are configured to allow heat transfer from one component to another. For example, such thermal communication can be achieved, without loss of generality, by snug contact between surfaces at an interface; one or more heat transfer materials or devices between surfaces; a connection between solid surfaces using a thermally conductive material system, wherein such a system can include pads, thermal grease, paste, one or more working fluids, or other structures with high thermal conductivity between the surfaces (e.g., heat exchangers); other suitable structures; or combinations of structures. Substantial thermal communication can take place between surfaces that are directly connected (e.g., contact each other) or indirectly connected via one or more interface materials.

As used herein, the terms "shunt" and "heat exchanger" have their broadest reasonable interpretation, including but not limited to a component (e.g., a thermally conductive device or material) that allows heat to flow from one portion of the component to another portion of the component. Shunts can be in thermal communication with one or more thermoelectric materials (e.g., one or more thermoelectric elements) and in thermal communication with one or more heat exchangers of the thermoelectric assembly or system. Shunts described herein can also be electrically conductive and in electrical communication with the one or more thermoelectric materials so as to also allow electrical current to flow from one portion of the shunt to another portion of the shunt (e.g., thereby providing electrical communication between multiple thermoelectric materials or elements). Heat exchangers (e.g., tubes and/or conduits) can be in thermal communication with the one or more shunts and one or more working fluids of the thermoelectric assembly or system. Various configurations of one or more shunts and one or more heat exchangers can be used (e.g., one or more shunts and one or more heat exchangers can be portions of the same unitary element, one or more shunts can be in electrical communication with one or more heat exchangers, one or more shunts can be electrically isolated from one or more heat exchangers, one or more shunts can be in direct thermal communication with the thermoelectric elements, one or more shunts can be in direct thermal communication with the one or more heat exchangers, an intervening material can be positioned between the one or more shunts and the one or more heat exchangers). Furthermore, as used herein, the words "cold," "hot," "cooler," "hotter" and the like are relative terms, and do not signify a particular temperature or temperature range.

Certain embodiments described herein provide a thermoelectric power generating (TEG) system comprising at least one thermoelectric subsystem and at least one heat exchanger (or portion thereof) in thermal communication with the at least one thermoelectric subsystem.

For example, the at least one thermoelectric subsystem can comprise at least one "cartridge-based thermoelectric system" or "cartridge" with at least one thermoelectric assembly 10 or at least one thermoelectric system as disclosed in U.S. Pat. Appl. Publ. No. 2013/0104953, which is incorporated in its entirety by reference herein. The cartridge is configured to apply a temperature differential across an array of thermoelectric elements 30, 40 of the cartridge in accordance with certain embodiments described herein. FIG. 6B of U.S. Pat. Appl. Publ. No. 2013/0104953 illustrates a perspective cross-sectional view of an example cartridge compatible with certain embodiments described herein. The cartridge of this figure includes an anodized aluminum "cold side" tube or conduit which is in thermal communication with a plurality of thermoelectric elements and a plurality of "hot side" heat transfer assemblies in thermal communication with the plurality of thermoelectric elements, such that a temperature differential is applied across the thermoelectric elements. As described in U.S. Pat. Appl. Publ. No. 2013/0104953 regarding certain configurations, the "hot side" heat transfer assemblies can have a first working fluid (e.g., gas or vapor) flowing across the "hot side" heat transfer assemblies and the "cold side" tube can have a second working fluid (e.g., water) flowing through it.

In certain embodiments, the at least one heat exchanger comprises at least one heat pipe or at least one thermosyphon. For example, the at least one heat pipe or at least one thermosyphon can replace the "cold side" tube of the cartridge of FIG. 6B of U.S. Pat. Appl. Publ. No. 2013/0104953. As used herein, the term "heat pipe" has its broadest reasonable interpretation, including but not limited to a device that contains a material in a first phase (e.g., a liquid) that is configured (i) to absorb heat at a first position within the device and to change (e.g., evaporate) into a second phase (e.g., gas or vapor) and (ii) to move while in the second phase from the first position to a second position within the device, (iii) to emit heat at the second position and to change back (e.g., condense) into the first phase, and (iv) to return while in the first phase to the first position. As used herein, the term "thermosyphon" has its broadest reasonable interpretation, including but not limited to a device that contains a material (e.g., water) that is configured (i) to absorb heat at a first position within the device, (ii) to move from the first position to a second position within the device, (iii) to emit heat at the second position. For example, the material within the thermosyphon can circulate between the first position and the second position passively (e.g., without being pumped by a mechanical liquid pump) to provide convective heat transfer from the first position to the second position. In certain embodiments, the at least one heat exchanger can utilize gravity or can otherwise be orientation-dependent. In certain embodiments, the at least one heat exchanger does not comprise any moving parts (except the material moving between the first and second positions), and can be characterized as providing passive energy transfer or heat exchange.

TEG Portion and HEX Portion

Figure 1A:
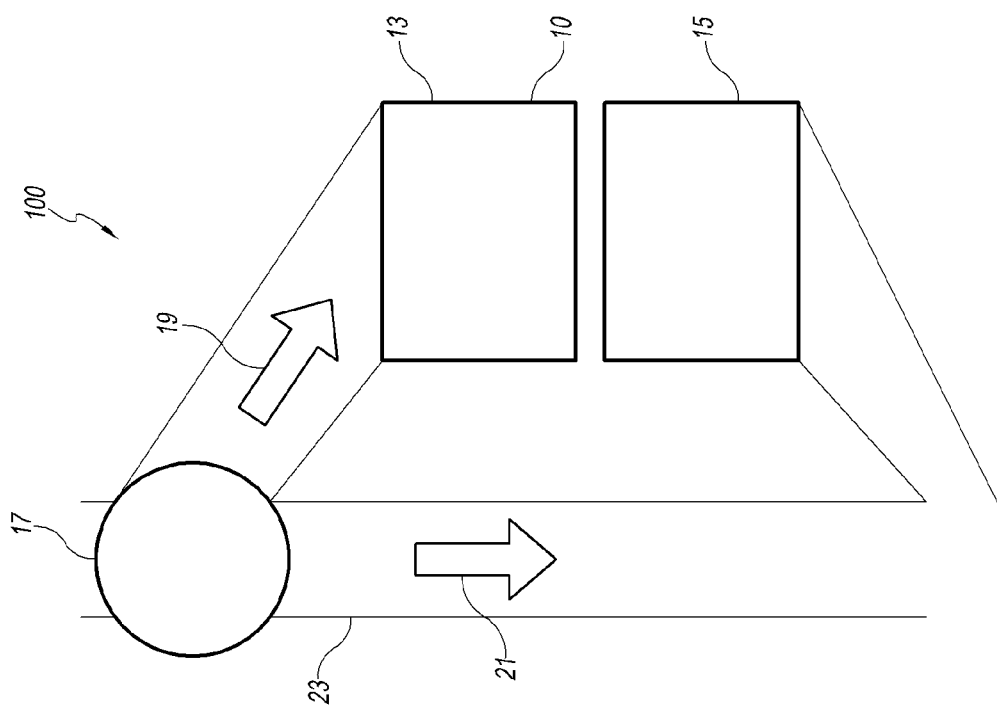
FIG. 1A schematically illustrates an example thermoelectric power generating system.

FIGS. 1A and 1B schematically illustrate example TEG systems in accordance with certain embodiments described herein. The TEG system 100 comprises a thermoelectric subsystem (e.g., a TEG portion 13 such as one or more TE cartridges) and a heat exchanger (HEX) portion 15 (e.g., in fluidic communication with the TEG portion 13, in thermal communication with the TEG portion 13, or both). In some embodiments, the example TEG systems 100 of FIGS. 1A and 1B also comprise at least one valve 17 that can allow flow of at least a portion of the first working fluid (e.g., gas as indicated by arrow 19) through the TEG portion 13, with any remaining portion of the first working fluid (as indicated by arrow 21) flowing through a bypass 23 as discussed in accordance with certain embodiments herein.

In some embodiments, a TEG system 100 is provided that comprises at least one thermoelectric assembly 10 (e.g., at least one TEG portion 13 such as one or more TE cartridges as disclosed in U.S. Pat. Appl. Publ. No. 2013/0104953). The at least one thermoelectric assembly 10 comprises at least one first heat exchanger 50 in thermal communication with at least a first portion of a first working fluid (e.g., hot-side fluid, gas, vapor as indicated by arrow 19). The first portion of the first working fluid flows through the at least one thermoelectric assembly 10. The at least one thermoelectric assembly 10 further comprises a plurality of thermoelectric elements 30, 40 (e.g., n-type and/or p-type) in thermal communication with the at least one first heat exchanger 50. The at least one thermoelectric assembly 10 further comprises at least one second heat exchanger (e.g., thermally conductive conduit or tube 102 and/or shunts 110) in thermal communication with the plurality of thermoelectric elements 30, 40 and with a second working fluid (e.g., cold-side fluid, gas, vapor, water) flowing through the at least one thermoelectric assembly 10. The second working fluid is cooler than the first working fluid. The TEG system 100 further comprises at least one heat exchanger portion 15 configured to have at least some of the first portion of the first working fluid flow through the at least one heat exchanger portion 15 after having flowed through the at least one thermoelectric assembly 10. The at least one heat exchanger portion 15 is configured to recover heat from the at least some of the first portion of the first working fluid as discussed below.

In some embodiments, the at least one thermoelectric assembly 10 (e.g., the at least one TEG portion 13) can be located in a region having a high temperature differential between the first working fluid and the environment of the at least one thermoelectric assembly 10, thereby providing a high thermoelectric efficiency. The at least one heat exchanger portion 15 can be in fluidic communication with the TEG portion 13 (e.g., downstream of the TEG portion 13) and dedicated to a particular use of the heat of the first working fluid that is not converted into electricity by the TEG portion 13.

For example, as schematically illustrated by FIG. 1A, the at least one thermoelectric assembly 10 may not convert all of the heat of the first working fluid (e.g., exhaust gas, hot fluid, first working fluid as indicated by arrow 19) into electricity, so the at least some of the first working fluid flowing out of the at least one thermoelectric assembly 10 and through the at least one heat exchanger portion 15 can be used by the at least one heat exchanger portion 15 for a particular purpose. The at least one thermoelectric assembly 10 may only be able to effectively convert "high quality" or "high temperature" heat of the first working fluid into electricity, so the "low quality" or "low temperature" heat that is not converted can be utilized for a particular purpose by the at least one heat exchanger portion 15, resulting in an overall increase of efficiency. In some embodiments, the at least one thermoelectric assembly 10 is configured to convert high-temperature heat of the first working fluid to electricity such that low-temperature heat of the first working fluid is received by the at least one heat exchanger portion 15. For example, the heat extracted from the first working fluid by the at least one thermoelectric assembly 10 can be less than or equal to a predetermined percentage (e.g., 40%, 50%, 60%, 70%) of the total amount of extractable or usable heat carried by the first working fluid to the at least one thermoelectric assembly 10, and the at least one heat exchanger portion 15 can be configured (e.g., optimized) to utilize (e.g., extract) some or all of the remaining portion (e.g., 60%, 50%, 40%, 30%) of the total amount of extractable or usable heat carried by the first working fluid to the at least one thermoelectric assembly 10).

As another example, as schematically illustrated by FIG. 1B, under certain conditions (e.g., having a first working fluid comprising a relatively low temperature exhaust gas, such as at start-up of an engine), at least a portion of the first working fluid (as indicated by arrow 21) can be diverted from flowing through the at least one thermoelectric assembly 10 (which may not be efficient at these conditions) but can be directed to the at least one heat exchanger portion 15 (e.g., via a bypass conduit 23) which receives and uses the first working fluid for a particular purpose.

Thus, the TEG system 100 can be configured to provide electrical power generation with high efficiency, and/or to provide recuperation (e.g., recovery) of the residual (e.g., low quality or low temperature) heat with high efficiency. In certain embodiments, the particular purpose for which the at least one heat exchanger portion 15 can use the low quality or low temperature heat can comprise recovering heat and applying it to other portions of the engine. In some embodiments, the first working fluid of the TEG system 100 comprises exhaust gas from an engine, and the at least one heat exchanger portion 15 is further configured to use recovered heat to warm at least one of an engine block of the engine, a catalytic converter of the engine, or a passenger compartment (e.g., cabin) of a vehicle. For example, at least a portion of the recovered heat can be put into the cooling system of an engine to achieve faster heating of the engine block at start-up (e.g., to warm up the oil lubrication system sooner) and/or at least a portion of the recovered heat can be put into the emission system to achieve faster heating or engagement of the catalytic converter to reach the "light-off" temperature sooner after start-up, thereby reducing overall emissions and/or at least a portion of the recovered heat can be used to improve the thermal comfort of the cabin to the driver and passengers of a vehicle. In certain such embodiments, the at least one heat exchanger portion 15 can comprise a first conduit through which the at least some of the first portion of the first working fluid flows and a second conduit through which at least a portion of the second working fluid flows. The second conduit can be in thermal communication with the first conduit such that the portion of the second working fluid receives heat from the at least some of the first portion of the first working fluid. In certain embodiments, the at least one thermoelectric assembly 10 and the at least one heat exchanger 15 can both utilize the same second working fluid.

As illustrated and disclosed with respect to FIGS. 1A and 1B, in some embodiments, the TEG system 100 further comprises at least one bypass conduit 23 and at least one valve 17. The at least one valve 17 is configured to selectively allow at least the first portion of the first working fluid (as indicated by arrow 19) to flow through the at least one first heat exchanger 50 and to selectively allow at least a second portion of the first working fluid (as indicated by arrow 21) to flow through the bypass conduit 23. In some embodiments, as illustrated in FIG. 1B, the at least one heat exchanger portion 15 is configured to receive at least some of the second portion of the first working fluid after having flowed through the at least one bypass conduit 23 and to recover heat from the at least some of the second portion of the first working fluid. For example, in some embodiments, a portion of at least one heat exchanger portion 15 can be in fluidic and/or thermal communication with the bypass conduit 23.

While the example TEG systems 100 of FIGS. 1A and 1B have the at least one valve 17 positioned upstream of the at least one thermoelectric assembly 10 and the at least one heat exchanger portion 15, other embodiments can have the at least one valve 17 positioned downstream of the at least one thermoelectric assembly 10 and the at least one heat exchanger portion 15 or between the at least one heat exchanger portion 15 and the at least one thermoelectric assembly 10. The at least one valve 17 can comprise one or more valves selected from the group consisting of a multiport valve and a proportional valve. The at least one valve 17 can determine whether the at least one thermoelectric assembly 10 only is engaged (e.g., the first working fluid flows through the at least one thermoelectric assembly 10 but not through the at least one heat exchanger portion 15), the at least one heat exchanger portion 15 only is engaged (e.g., the first working fluid flows through the at least one heat exchanger portion 15 but not through the at least one thermoelectric assembly 10), or both the at least one thermoelectric assembly 10 and the at least one heat exchanger portion 15 are engaged (e.g., the first working fluid flows through both the at least one thermoelectric assembly 10 and the at least one heat exchanger portion 15). The at least one heat exchanger portion 15 can be engaged with the at least one bypass conduit 23, in addition to being engaged to the primary gas flow (as indicated by arrow 19), as schematically illustrated by FIG. 1B.

FIG. 2 schematically illustrates another example TEG system 100 in accordance with certain embodiments described herein. In some embodiments, the TEG system 100 comprises at least one second heat exchanger portion 25 (e.g., located upstream of the at least one thermoelectric assembly 10) configured to have at least the first portion of the first working fluid (as indicated by arrow 19) flow through the at least one second heat exchanger portion 25 prior to flowing through the at least one thermoelectric assembly 10. The at least one second heat exchanger portion 25 can be configured to reduce a temperature of the first portion of the first working fluid.

For example, as illustrated in FIG. 2, the at least one second heat exchanger portion 25 is located upstream of the at least one thermoelectric assembly 10 in order to decrease the temperature of the flowing first working fluid as indicated by arrow 19 prior to flowing through the at least one thermoelectric assembly 10 (e.g., for applications in which the temperature of the first working fluid would be too high for the TE materials of the at least one thermoelectric assembly 10). Possible advantages of such an example TEG system 100 include, but are not limited to, protection of the TE material or elements from overheating (e.g., excessive temperatures), electrical power generation with high efficiency, and/or recuperation of the residual heat with high efficiency.

Figure 12:
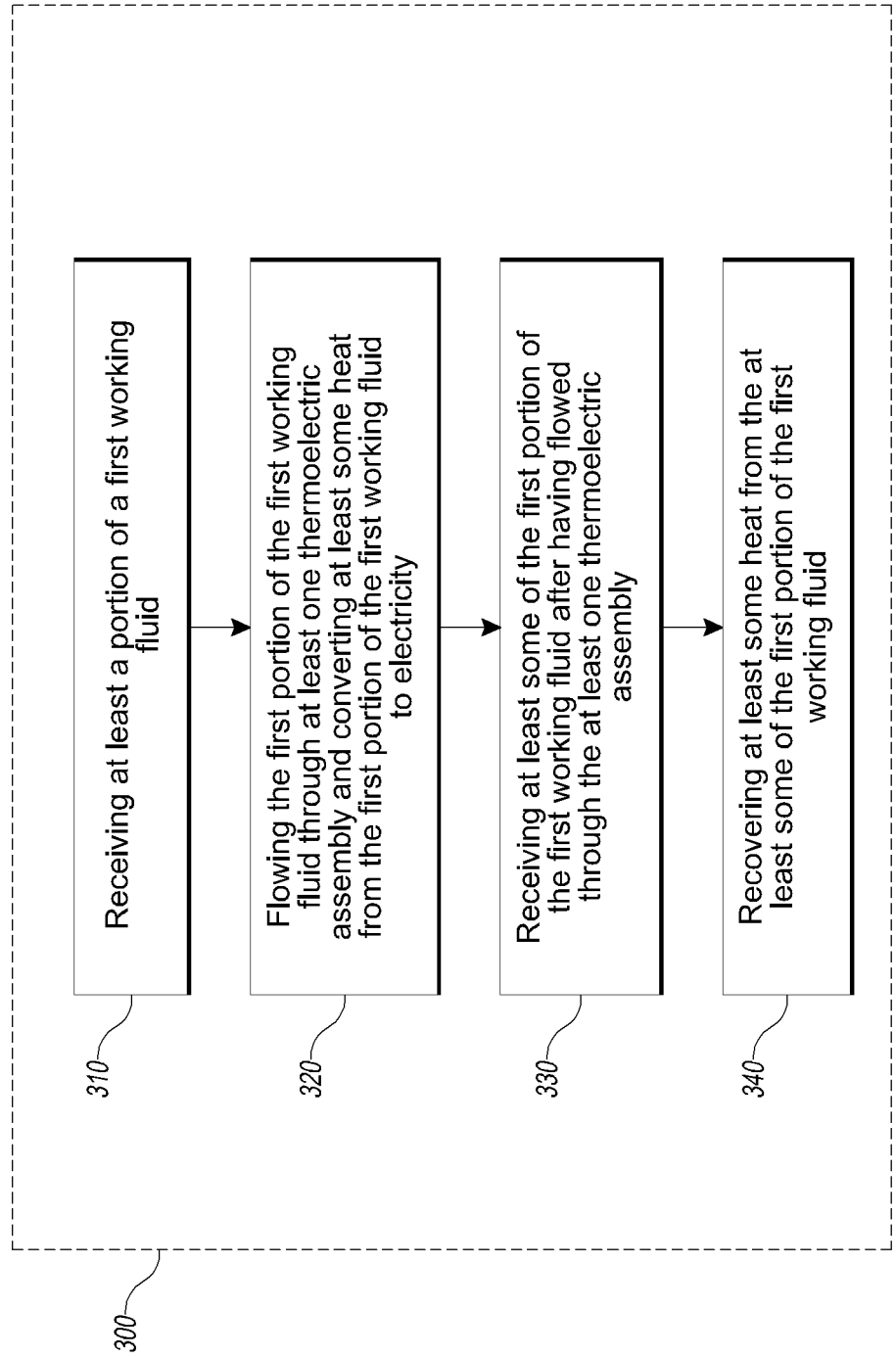
FIG. 12 is a flow diagram of an example method of generating electricity.

A method 300 for generating electricity according to certain embodiments described herein is illustrated in the flow diagram of FIG. 12. While the method 300 is described below by referencing the structures described above, the method 300 may also be practiced using other structures. In an operational block 310, the method 300 comprises receiving at least a portion of a first working fluid. In an operational block 320, the method 300 further comprises flowing the first portion of the first working fluid through at least one thermoelectric assembly 10 and converting at least some heat from the first portion of the first working fluid to electricity. In an operational block 330, the method 300 further comprises receiving at least some of the first portion of the first working fluid after having flowed through the at least one thermoelectric assembly 10. In an operational block 340, the method 300 further comprises recovering at least some heat from the at least some of the first portion of the first working fluid (e.g., using the at least one heat exchanger portion 15).

In some embodiments, converting at least some heat from the first portion of the first working fluid to electricity comprises converting high-temperature heat from the first working fluid to electricity. Further, recovering at least some heat from the at least some of the first portion of the first working fluid comprises recovering low-temperature heat of the first working fluid.

In some embodiments, the method 300 of generating electricity further comprises selectively allowing at least the first portion of the first working fluid to flow through the at least one thermoelectric assembly 10 and selectively allowing at least a second portion of the first working fluid to not flow through the at least one thermoelectric assembly 10 (e.g., through at least one bypass conduit 23).

In some embodiments, the first working fluid comprises an exhaust gas from an engine and the method further comprises using the recovered heat to warm at least one of an engine block of the engine and a catalytic converter of the engine.

In some embodiments, the method 300 of generating electricity further comprises reducing a temperature of the first portion of the first working fluid prior to flowing through the at least one thermoelectric assembly 10 (e.g., using at least one second heat exchanger portion 25).

Temperature-Activated Heat Exchanger

Regarding the overheating protection, in TEG operation, there is often a limit to the temperatures that the TE material can withstand. Unfortunately, in extreme situations, the exhaust gas temperatures can be excessive and can cause the TE surface temperature to exceed its limit unless it is regulated. To prevent the TE material from overheating, some or all of the exhaust flow can be bypassed (e.g., be directed away) from the TE material. However, such an embodiment may bypass more potentially valuable heat than is necessary or desirable. For example, all of the heat may be bypassed when the flow is bypassed, as opposed to just the high quality or high temperature heat.

In certain embodiments described herein, the TE surface temperature can be controlled by dissipating the excessive heat prior to entering the at least one thermoelectric assembly 10. The remainder of the heat in the exhaust flow could then continue into the at least one thermoelectric assembly 10, thereby preventing the unnecessary bypass of valuable heat.

Figure 3:
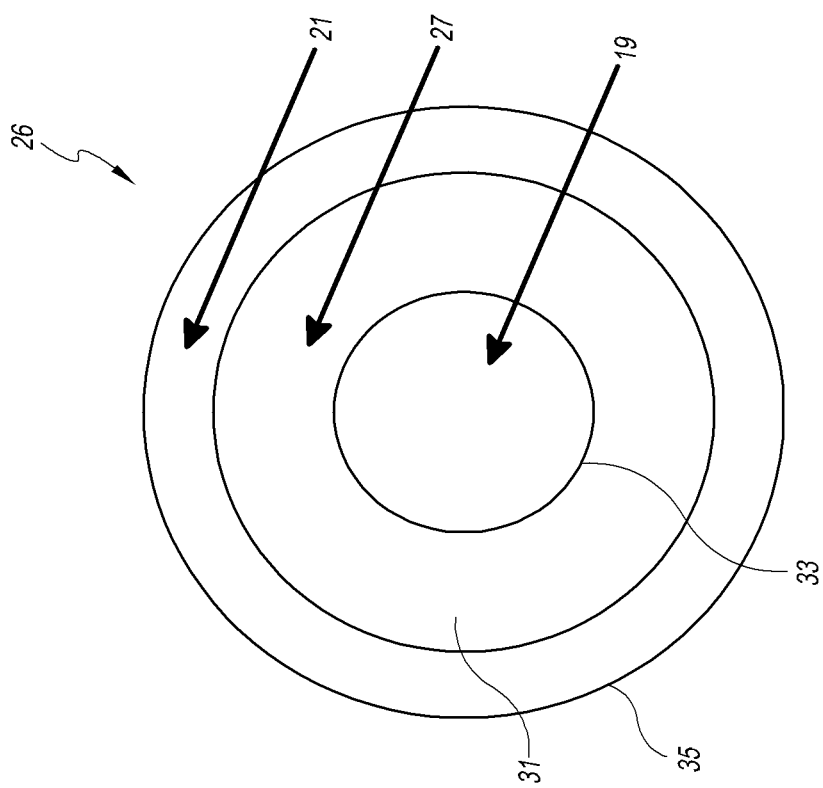
FIG. 3 schematically illustrates a cross-sectional view of an example heat exchanger portion.

Certain embodiments described herein advantageously only dissipate heat when there is an excess amount of heat. FIGS. 3 and 4 schematically illustrate cross-sectional view of example heat exchanger portions 26 in accordance with certain embodiments described herein. The heat exchanger portion 26 can be located upstream from the at least one thermoelectric assembly 10 and in series with at least one thermoelectric assembly 10 (e.g., the first working fluid flows through the heat exchanger portion 26 prior to flowing through the at least one thermoelectric assembly 10). For example, the at least one heat exchanger portion 25 described above can comprise the heat exchanger portion 26. In certain embodiments, the heat exchanger portion 26 can dissipate relatively little heat at low temperatures, can use heat pipe technology to be activated at higher temperatures to dissipate excess heat without bypassing valuable flow, and can be a passive way to provide TEG overtemperature or overheating protection. FIGS. 3 and 4 schematically illustrate some example embodiments and do not represent all of the related embodiments that could be employed in accordance with certain embodiments described herein. Furthermore, the heat exchanger portion 26 can be used in a TEG system that also includes the structures described above with regard to FIGS. 1A, 1B, and 2.

As schematically illustrated in FIG. 3, the heat exchanger portion 26 can comprise a central region 19 (e.g., conduit) and at least one heat pipe 27 (e.g., a first annular region concentric with the central region 19). The central region 19 can be configured to allow the exhaust gas to flow through (e.g., in a direction generally perpendicular to the plane of the cross-sectional view in FIG. 3). The at least one heat pipe 27 can be configured to contain a high-temperature fluid 31. An inner wall 33 of the heat pipe 27 can be in thermal communication with the exhaust gas and an outer wall 35 of the heat pipe 27 can be in thermal communication with an outer region 21 (e.g., a second concentric annular region bounded by a second conduit, as schematically illustrated in FIG. 3). The high-temperature fluid 31 can be configured to undergo evaporation at the inner wall 33 (e.g., in thermal communication with the exhaust gas at a first temperature) and can be configured to undergo condensation at the outer wall 35 (e.g., in thermal communication with the outer region 21 at a second temperature less than the first temperature).

For example, the outer region 21 (e.g., the second concentric annular region bounded by the second conduit) can be configured to allow a coolant (e.g., gas or liquid) to flow through (e.g., in a direction generally perpendicular to the plane of the cross-sectional view in FIG. 3). While FIG. 3 shows the central region 19, the heat pipe 27, and outer region 21 being generally circular and generally concentric with one another, other shapes and configurations (e.g., non-concentric) are also compatible with certain embodiments described herein. In other embodiments, the outer region 21 can comprise a heat sink (e.g., a device that dissipates at least a portion of the heat from the high-temperature fluid).

In certain embodiments, the heat pipe 27 can be used to provide a temperature-activated heat exchanger. The evaporator portion of the heat pipe or thermal plane could work above a certain temperature (e.g., 700 C), for example, using one or more high-temperature heat pipe fluids 31, such as Li, Na, K, and Cs, which are known in the art. In certain embodiments, at low temperatures (e.g., before the high temperature condition is reached), the heat transfer is poor, based on natural convection of the high-temperature fluid. Once activated, the heat exchanger portion 26 of certain embodiments can use the high heat transfer capability of boiling and condensing to transfer heat. For example, heat transfer coefficients can go up by a factor of 100 from the low temperature regime to the high temperature regime.

FIG. 4 schematically illustrates a cross-sectional view of another example heat exchanger portion 26 in accordance with certain embodiments described herein. The at least one heat pipe 27 can extend from the central region 19 containing the exhaust gas to the outer region 21 containing the coolant or heat sink. For example, a first portion 37 of the at least one heat pipe 27 can be in thermal communication with the exhaust gas and a second portion 39 of the at least one heat pipe 27 can be in thermal communication with the coolant or heat sink. A region 41 between the central region 19 and the outer region 21 can be substantially thermally insulating (e.g., can contain gas or air), or can contain another material. In certain embodiments, the at least one heat pipe 27 can comprise one or more generally cylindrical heat pipes (e.g., a series of cylindrical heat pipes), while in certain other embodiments, the at least one heat pipe can comprise one or more generally planar heat pipes extending along the axis of the heat exchanger portion 26 (e.g., along a direction generally perpendicular to the cross-sectional view of FIG. 4).

Protecting Temperature-Sensitive Components

FIGS. 5A and 5B schematically illustrate two example TEG systems 100 comprising temperature-sensitive components in accordance with certain embodiments described herein. In some embodiments, the TEG system 100 can comprise at least one valve 17 that comprises at least one component that is sensitive to high temperatures, and the at least one component is in thermal communication with the second working fluid (e.g., flowing through a coolant circuit 51 of the TEG system 100). In certain embodiments, the TEG system 100 takes advantage of available colder surfaces (e.g., due to the presence of a coolant circuit 51 configured to have the second working fluid flow therethrough) in order to protect temperature-sensitive components (e.g., temperature-sensitive valve sub-components, such as the actuator 53 and the electronics 55). The temperature-sensitive components can be used to move, control or actuate the at least one valve 17 or a drive shaft or flexible wire 57 connected to the valve 17. For example, the TEG system 100 can keep such temperature-sensitive components below a predetermined temperature (e.g., below 150 C). In certain embodiments, the TEG system 100 can comprise a phase-change material located between the coolant circuit 51 and the temperature-sensitive components (e.g., electronics 55) to further protect against temperature spikes. Having the at least one valve 17 in thermal communication with the coolant circuit 51 can be used in a TEG system 100 that also includes one or more of the structures described above with regard to FIGS. 1-4.

Thermoelectric Assemblies Integrated into a Muffler

Figure 6:
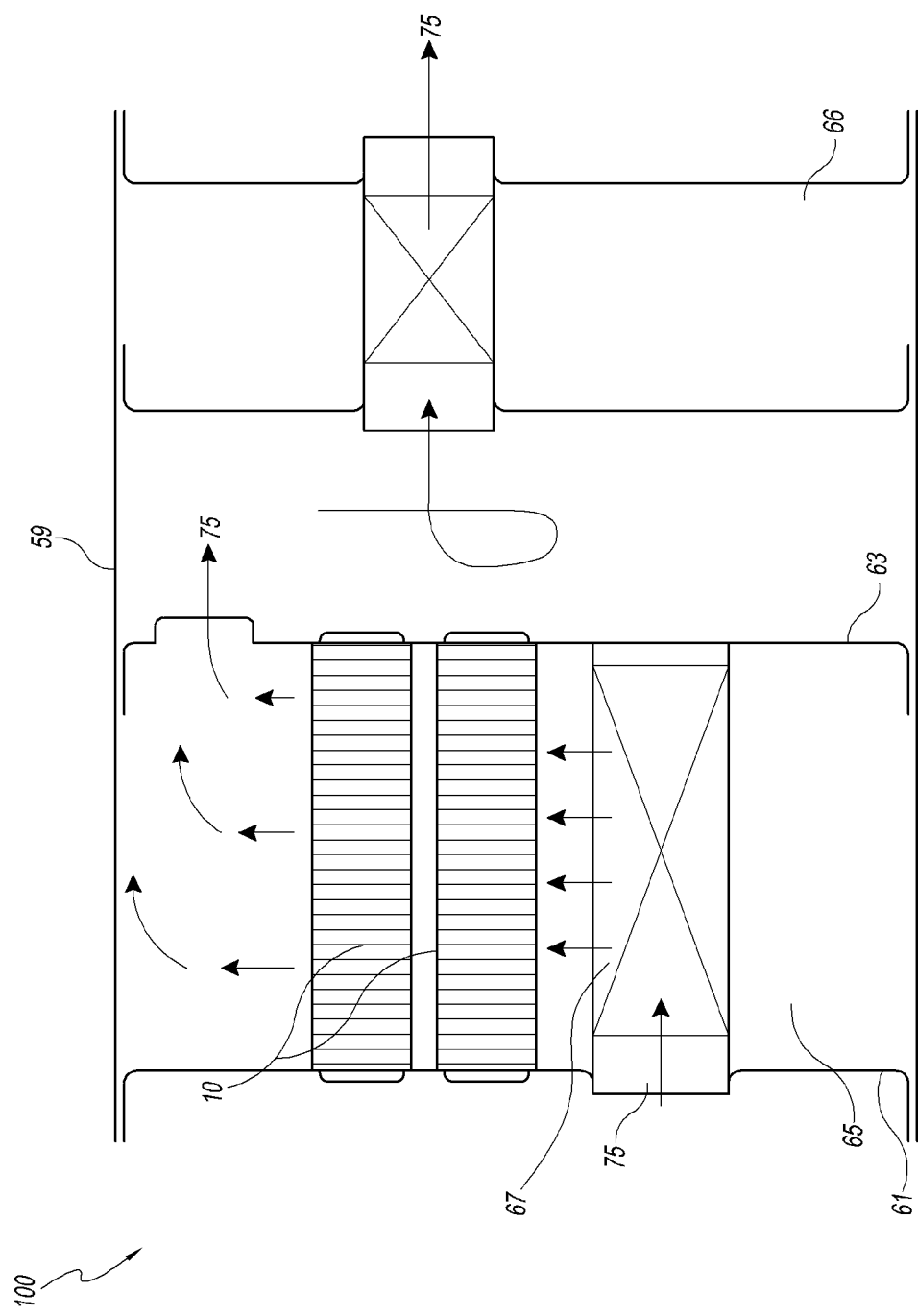
FIG. 6 schematically illustrates an example thermoelectric power generating system having at least one TEG device integrated into a muffler.

In certain embodiments, the TEG system 100 can integrate at least one thermoelectric assembly 10 with acoustic dampening components (e.g., mufflers). FIG. 6 schematically illustrates an example TEG system 100 comprising at least one thermoelectric assembly 10 (e.g., one or more cartridges) integrated into a muffler 59, in accordance with certain embodiments described herein. In some embodiments, the first working fluid of such a TEG system 100 comprises exhaust gas 75 from an engine as discussed above. The at least one thermoelectric assembly 10 is integrated into at least one muffler 59 of the engine exhaust system. For example, the at least one thermoelectric assembly 10 can be positioned between two muffler baffles 61, 63, and additional muffler chambers can be used to achieve the desired acoustic performance. In certain embodiments, the at least one thermoelectric assembly 10 can be positioned in a first chamber (e.g., inlet chamber 65) to reduce temperature loss before the at least one thermoelectric assembly 10. The gas can stream into the first chamber through a perforation field 67 (see, e.g., FIG. 6) or directly into the first chamber. An additional deflecting plate could be used to get a homogeneous flow distribution to the at least one thermoelectric assembly 10. The gas can stream out of the muffler 59 through a second chamber (e.g., outlet chamber 66).

Figure 7:
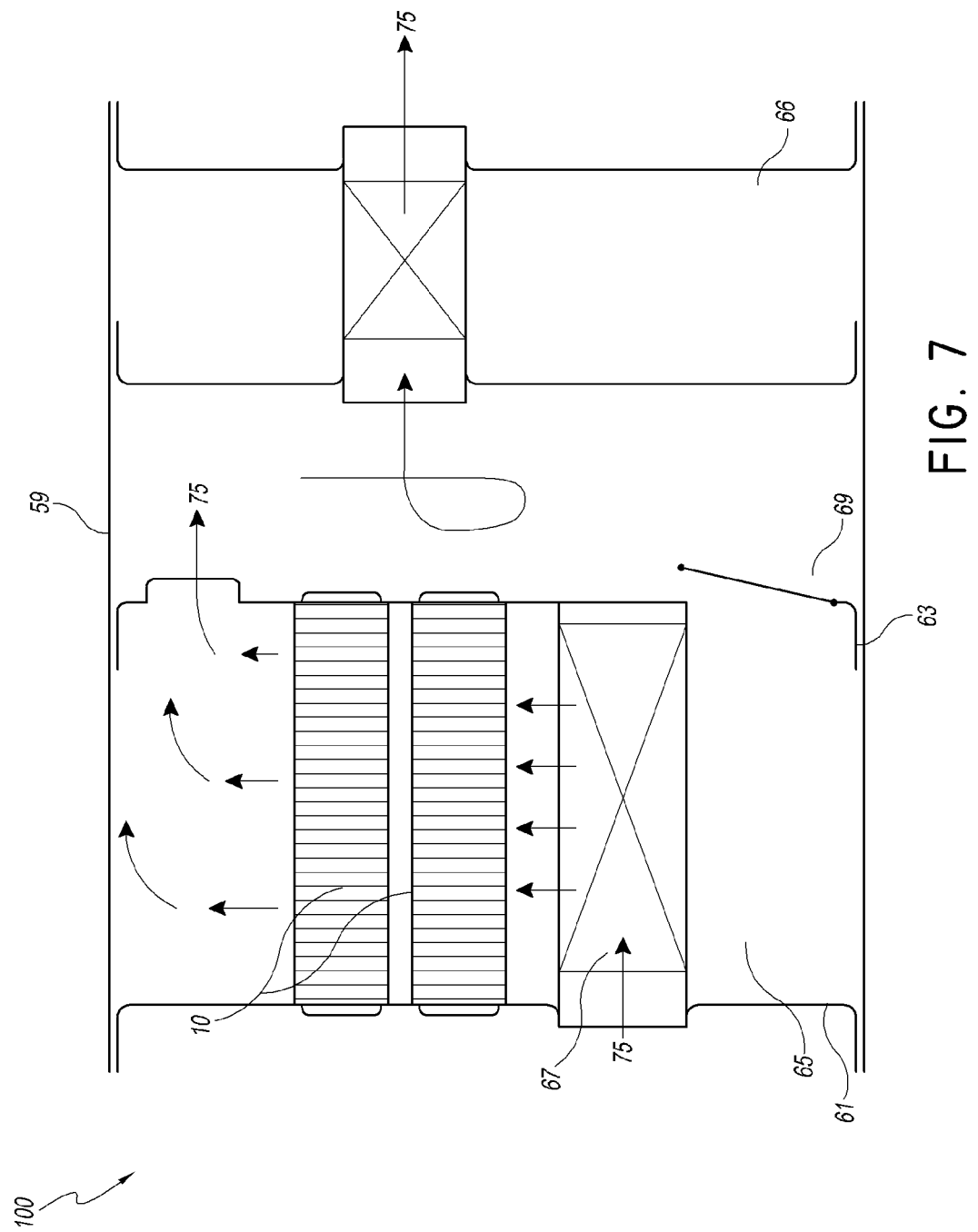
FIG. 7 schematically illustrates another example thermoelectric power generating system having at least one TEG device integrated into a muffler.

FIG. 7 schematically illustrates another example TEG system 100 comprising at least one thermoelectric assembly 10 (e.g., one or more cartridges) integrated into a muffler 59, in accordance with certain embodiments described herein. The TEG system 100 comprises at least one spring-forced valve 69 (e.g., having mechanical control) between the chambers (e.g., at the inner baffle 63 of the muffler) which is configured to open at a predetermined condition (e.g., the maximum mass flow/temperature conditions) to allow the exhaust gas to bypass the at least one thermoelectric assembly 10 and to avoid overheating of the at least one thermoelectric assembly 10. The at least one valve 69 can be tuned appropriately be selection of the spring force and the cross-sectional area through which exhaust gas can flow. For example, these parameters can be selected based on system-level constraints or requirements such as the maximum engine back-pressure and the exhaust gas flow rate at which the maximum engine back-pressure is to occur.

Figure 8:
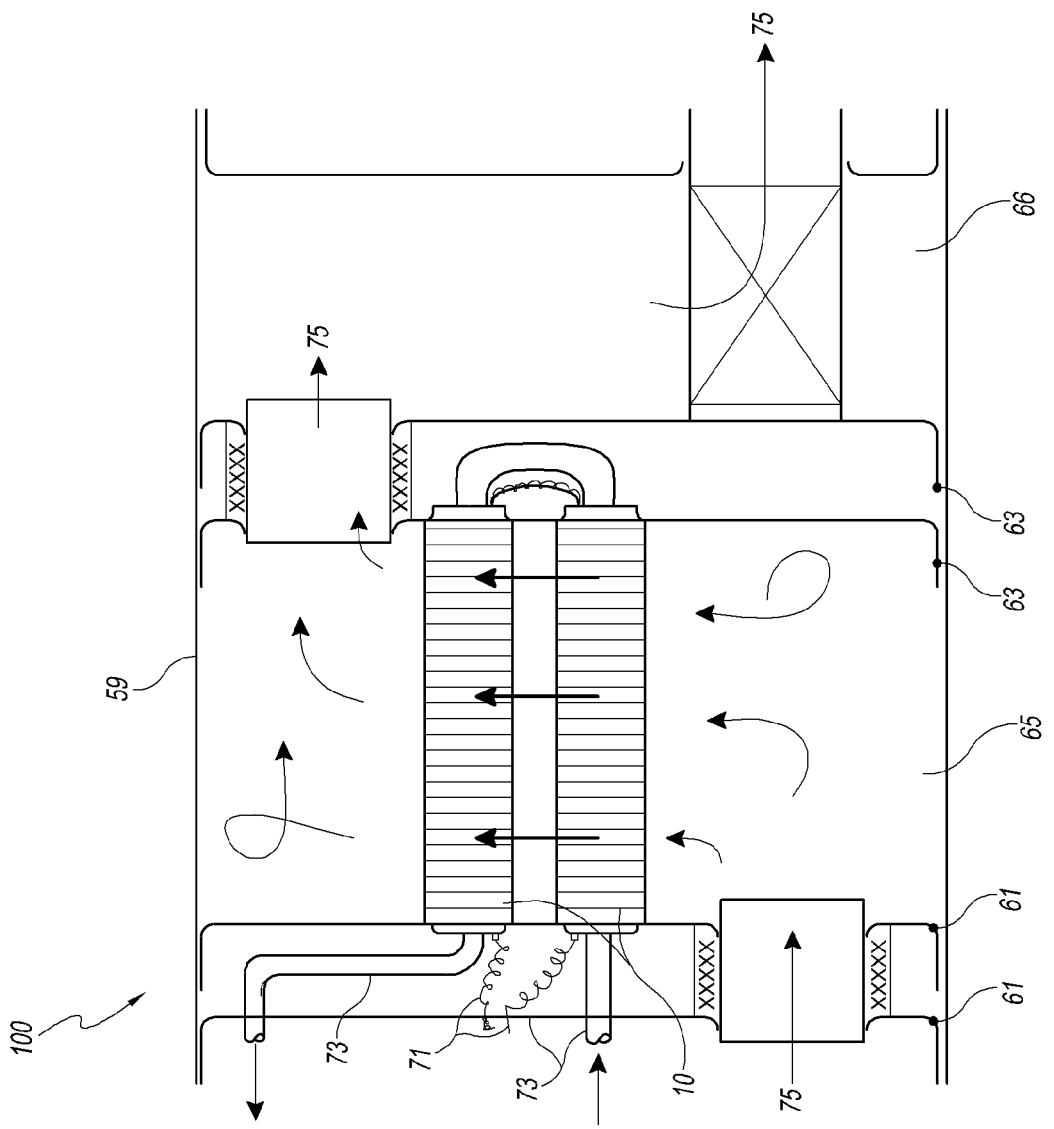
FIG. 8 schematically illustrates another example thermoelectric power generating system having at least one TEG device integrated into a muffler.

FIG. 8 schematically illustrates another example TEG system 100 comprising at least one thermoelectric assembly 10 (e.g., one or more cartridges) integrated into a muffler 59, in accordance with certain embodiments described herein. The TEG system 100 can be configured to protect various components, such as the electrical cables 71 and coolant (e.g., water) pipes 73, against environment conditions and to have them covered to avoid damage caused by any other objects. In certain embodiments, the cabling and tubing are not visible from outside the muffler 59. In certain embodiments, the TEG system 100 can comprise acoustic material downstream of the at least one thermoelectric assembly 10. Other benefits can include, but are not limited to, lower temperatures of the acoustic material, lower flow velocities, and the potential to use lower cost and weight canning/shell (e.g., plastic versus metal) due to the lower temperatures. Integration of the at least one thermoelectric assembly 10 with a muffler as described above can be used in a TEG system 100 that also includes one or more of the structures described above with regard to FIGS. 1-5.

Multiple-Shell Muffler

Figure 9A:
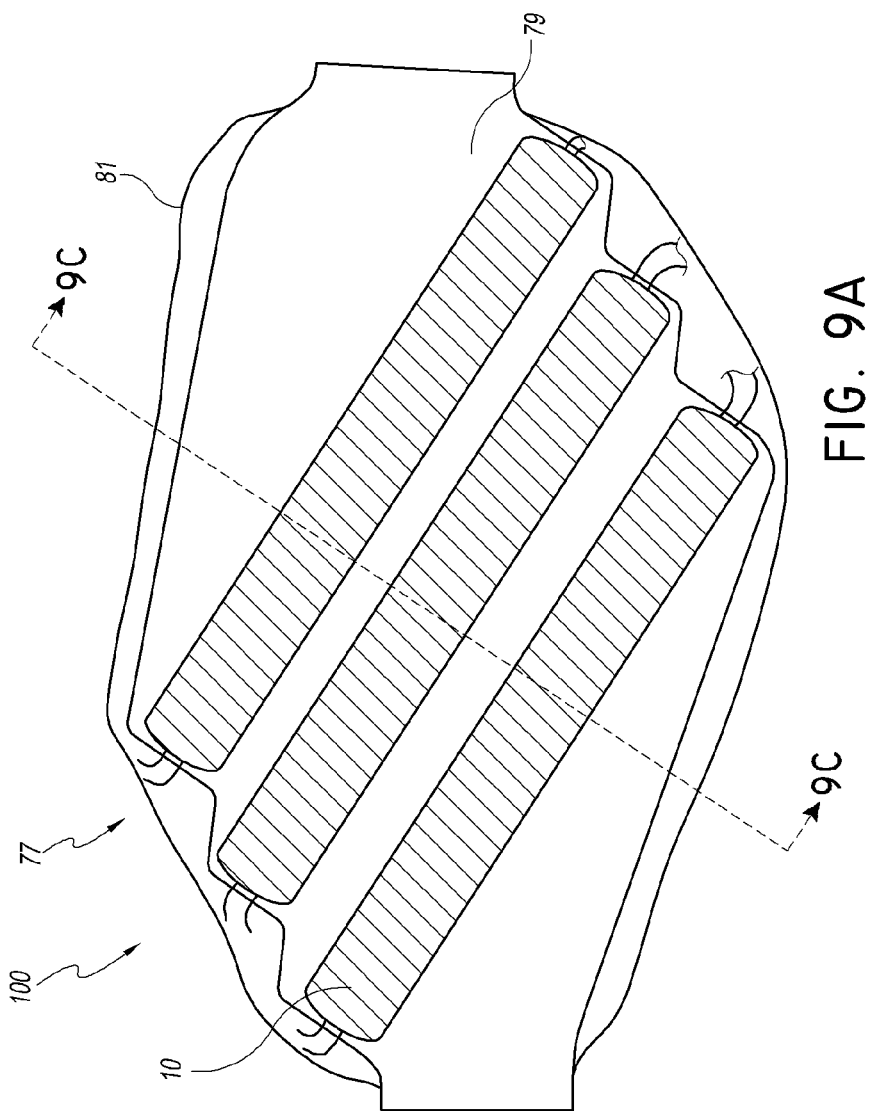
FIG. 9A schematically illustrates an example thermoelectric power generating system having a multiple-shell muffler.
Figure 9C:
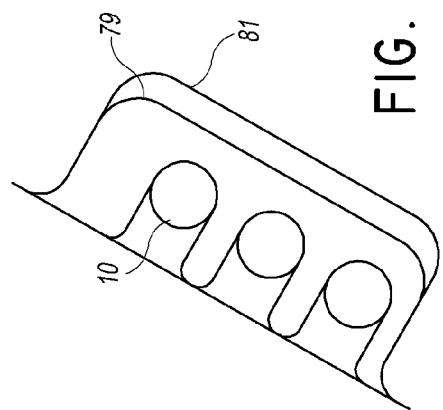
FIG. 9C schematically illustrates a cross-sectional view of the thermoelectric power generating system of FIG. 9A.

FIG. 9A schematically illustrates an example TEG system 100 comprising a multiple-shell muffler 77 in which an inner shell 79 contains at least one thermoelectric assembly 10 (e.g., one or more cartridges) and an outer shell 81 contains components (e.g., electrical cables, coolant pipes, tubes, or conduits), portions of which are outside the inner shell 79 and that are to be protected, in accordance with certain embodiments described herein. FIG. 9C schematically illustrates a cross-sectional view of the example TEG system 100 of FIG. 9A in the plane indicated by arrows. Certain embodiments advantageously integrate multiple functions into the shells of the muffler 77. One or all of the muffler shells can be a stamped part so that the geometry can be design flexible.

In certain embodiments, the inner shell 79 contains or carries the at least one thermoelectric assembly 10 and the outer shell 81 (e.g., cover shell) contains, supports, and protects the electrical cables and coolant (e.g., water) pipes. For a controlled routing of the pipes and their fixation, the shell design can be formed accordingly. Various configurations are also compatible with certain embodiments described herein. For example, the TEG system 100 can comprise an inner shell 79 for the at least one thermoelectric assembly 10 and inner baffles that can provide the desired acoustic reduction. A catalytic converter can be integrated into the inner shell 79 (e.g., upstream of the at least one thermoelectric assembly). The TEG system 100 can comprise a first (e.g., inner) shell 79 for the TE cartridges, a second shell containing a thermal insulation material 83, and a third (e.g., outer) shell 81 containing the electrical cabling and coolant (e.g., water) routing.

Coolant channels can be formed into the half-shell design without separate coolant tubing. FIG. 9B schematically illustrates an example TEG system 100 in which coolant (e.g., water) routing is integrated into the multiple-shell muffler 77, in accordance with certain embodiments described herein. The TEG system 100 can comprise an inner shell 79, a middle shell 83, and an outer shell 81. In certain embodiments, the coolant (e.g., water) routing is in the outer shell 81 (e.g., between the middle shell 83 and the outer shell 81), and the electrical cables 89 are routed in the middle shell 83 (e.g., between the middle shell 83 and the inner shell 79) or on the surface of the middle shell 83. In some embodiments, the coolant enters through one or more inlets 85 and exits through one or more outlets 87 in the outer shell 81. Certain embodiments further comprise an insulation mat 91 between the cartridge support shell (e.g., inner shell 79) and the middle shell 83. The insulation mat 91 can provide one or more of the following functions: (i) heat protection of the cables 89 and the coolant conduit (e.g., manifold 93); (ii) noise reduction of the muffler to the environment; (iii) reduction of the outer surface temperature; and (iv) reduction of thermal losses. The multiple-shell muffler can be used in a TEG system 100 that also includes one or more of the structures described above with regard to FIGS. 1-8.

Integration of Bypass and Helmholtz Resonator

Figure 10:
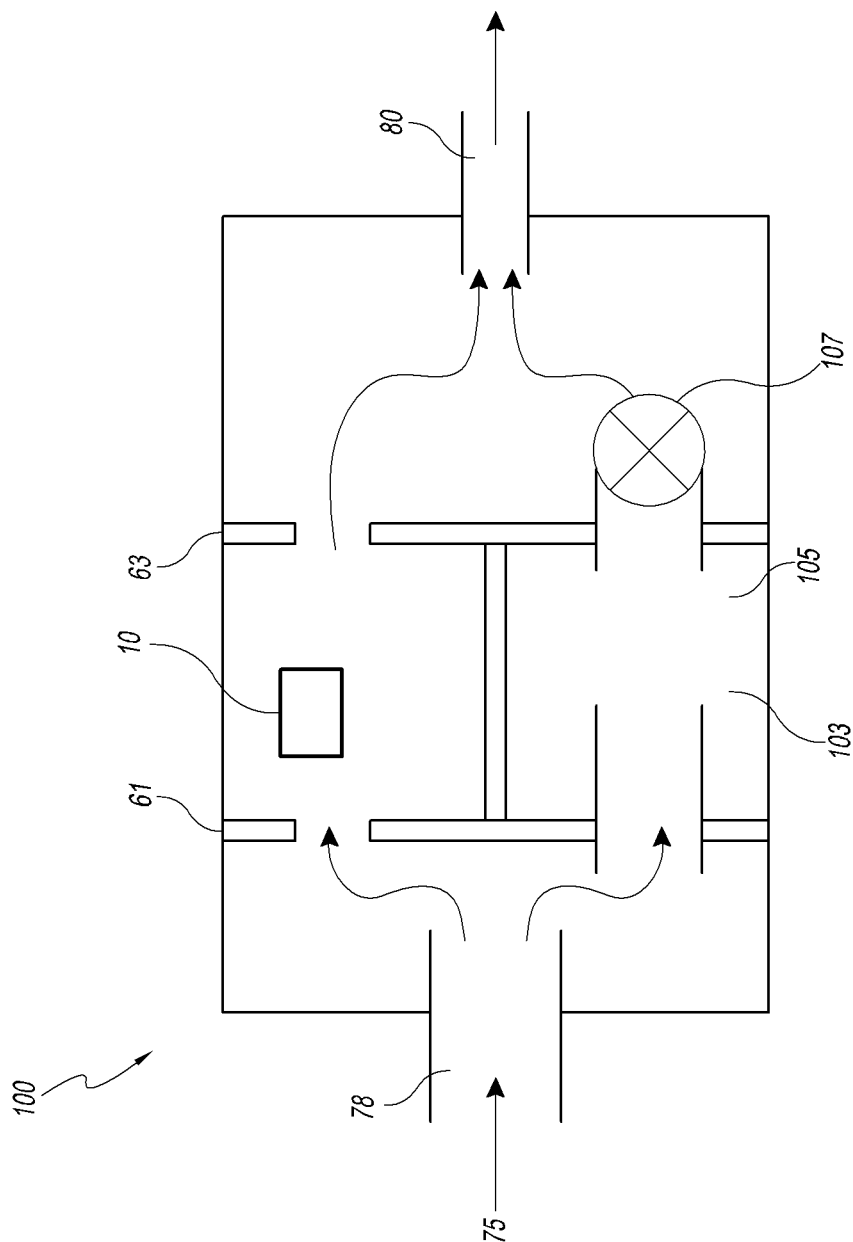
FIG. 10 schematically illustrates an example thermoelectric power generating system having at least one Helmholtz resonator.

FIG. 10 schematically illustrates an example TEG system 100 comprising a bypass 103, at least one thermoelectric assembly 10, and at least one Helmholtz resonator 105. Helmholtz resonators are often used in of exhaust systems, in order to dampen low frequency engine noises, or to mitigate noise peaks at specific frequencies. The bypass 103 can be designed in order to act as a Helmholtz resonator when the valve 107 is closed (e.g., by adding an expansion chamber). The large volume of air in the chamber can serve as the spring and the air in the neck can serve as the oscillating mass. The working fluid 75 (e.g., exhaust, air) can enter through an inlet 78 and exit through an outlet 80 as indicated by the arrows. The at least one Hemholtz resonator 105 can be used in a TEG system 100 that also includes one or more of the structures described above with regard to FIGS. 1-9.

Valve to Control Mass Flow

Figure 11:
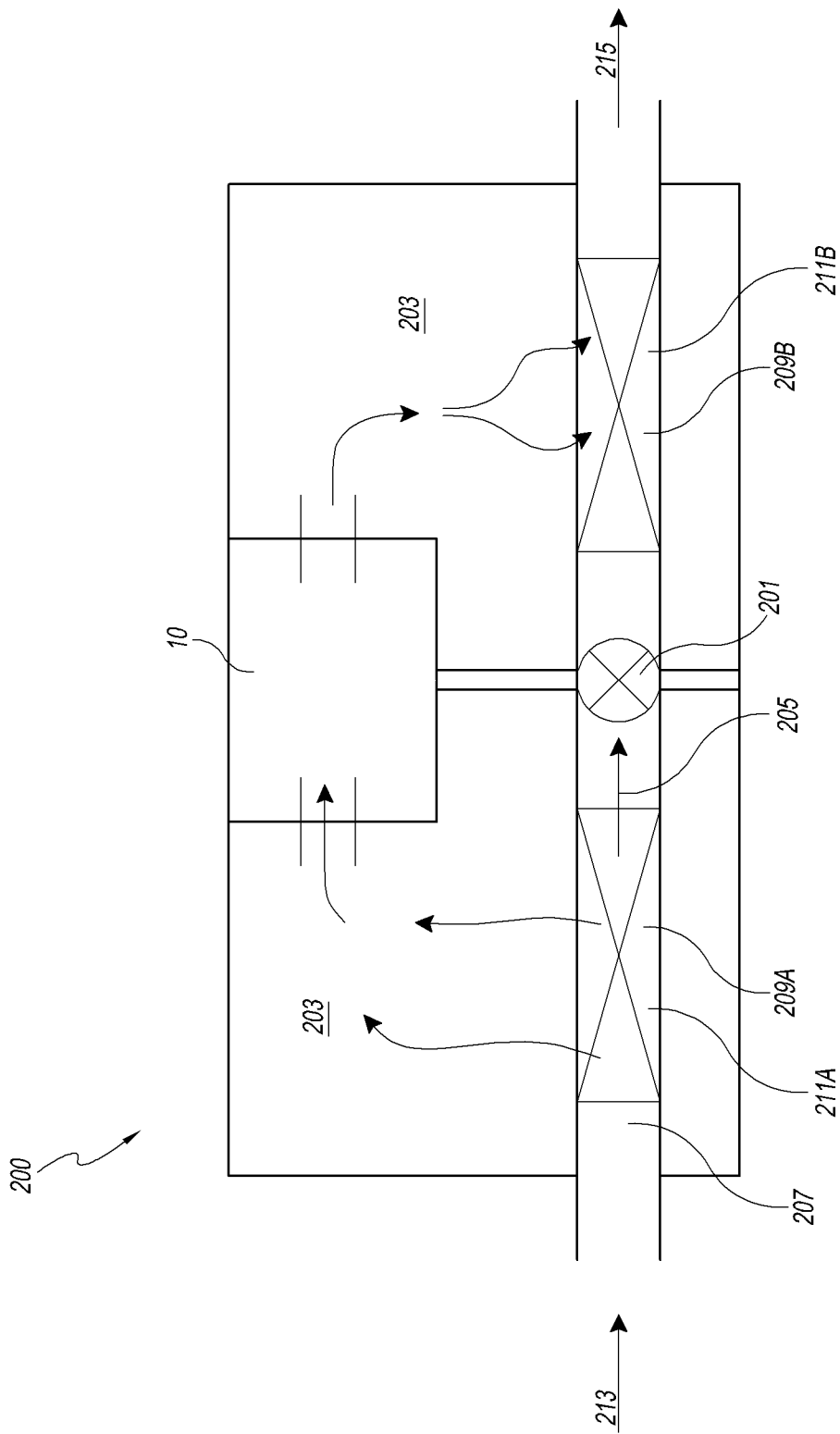
FIG. 11 schematically illustrates an example thermoelectric power generating system having at least one TEG device integrated into a muffler.

FIG. 11 schematically illustrates an example TEG system 200 in accordance with certain embodiments described herein. In some embodiments, the TEG system 200 comprises at least one thermoelectric assembly 10 (e.g., TEG device, cartridge). The TEG system 200 further comprises a first flow path (indicated by arrows 203) with a first flow resistance. The first flow path 203 is through the at least one thermoelectric assembly 10. The TEG system 200 further comprises a second flow path (indicated by arrows 205) with a second flow resistance lower than the first flow resistance. The second flow path bypasses the at least one thermoelectric assembly 10. The TEG system 200 further comprises at least one valve 201 (e.g., flap valve, proportional valve, three-way valve) configured to vary a first amount of a working fluid (e.g., exhaust) flowing along the first flow path and a second amount of the working fluid flowing along the second flow path.

For example, the at least one valve 201 can be controlled to vary the first amount (e.g., fraction) of the working fluid to be any value between zero and 100% of the total amount of working fluid flowing through the TEG system 200 (e.g., 0%, 5%, 10%, 15%, 20%, 25%, 30%, 40%, 50%, 60%, 70%, 75%, 80%, 85%, 90%, 95%, 100%). The at least one valve 201 can be controlled to vary the second amount (e.g., fraction) of the working fluid to be any value between zero and 100% of the total amount of working fluid flowing through the TEG system 200 (e.g., 0%, 5%, 10%, 15%, 20%, 25%, 30%, 40%, 50%, 60%, 70%, 75%, 80%, 85%, 90%, 95%, 100%).

In some embodiments, the at least one thermoelectric assembly 10 is integrated into a muffler of an engine exhaust system, in accordance with certain embodiments described herein. In certain embodiments, the TEG system 200 can be designed in order to ensure 100% mass flow through the bypass (e.g., second flow path) when the valve 201 is open.

In some embodiments, the TEG system 200 further comprises at least one conduit 207 comprising at least one wall portion 209 having a plurality of perforations 211. The first flow path extends through the plurality of perforations 211. In some embodiments, the at least one conduit 207 further comprises an inlet 213 and an outlet 215, and the at least one valve 201 is between the inlet 213 and the outlet 215

In some embodiments, the at least one wall portion 209 comprises a first wall portion 209A with a first plurality of perforations 211A and a second wall portion 209B with a second plurality of perforations 211B. The at least one valve 201 is positioned between the first wall portion 209A and the second wall portion 209B. The first flow path extends through the first plurality of perforations 211A outwardly from the at least one conduit 207 and through the second plurality of perforations 211B inwardly to the at least one conduit 207. The second flow path does not extend through the first plurality of perforations 211A and does not extend through the second plurality of perforations 211B.

For example, a flow path can be designed for the TEG branch in which the back-pressure field is higher than the pressure field in the bypass when the at least one valve 201 is open. While FIG. 11 schematically illustrates the first plurality of perforations 211A and the second plurality of perforations 211B, other structures (e.g., by introducing flow bends) may be used instead to cause the flow resistance in the TEG branch (e.g., first flow path) to be higher than the flow resistance in the bypass (e.g., the second flow path). The flow path can also be designed to use the flow momentum to increase the flow passage in the bypass pipe (e.g., by using a straight pipe) when the valve is closed. Certain embodiments advantageously provide and utilize a simpler and cost-effective flap valve, instead of a three-way valve. Certain embodiments described herein can use one or more passive (e.g., spring-actuated) valves or valves actuated by thermal wax actuators connected to the coolant circuit. The at least one valve 201 can be used in a TEG system 100 that also includes one or more of the structures described above with regard to FIGS. 1-10.

Figure 13:
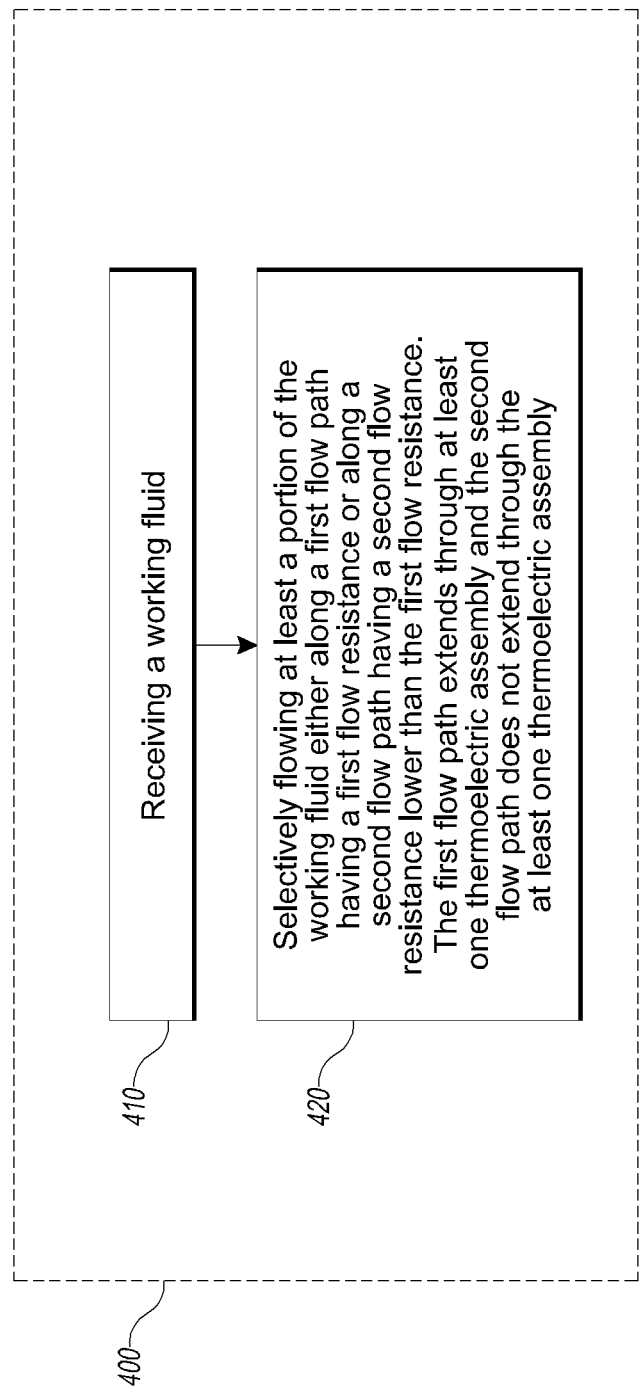
FIG. 13 is a flow diagram of another example method of generating electricity.

A method 400 for generating electricity according to certain embodiments described herein is illustrated in the flow diagram of FIG. 13. While the method 400 is described below by referencing the structures described above, the method 400 may also be practiced using other structures. In an operational block 410, the method 400 comprises receiving a working fluid. In an operational block 420, the method 400 further comprises selectively flowing at least a portion of the working fluid either along a first flow path having a first flow resistance or along a second flow path having a second flow resistance lower than the first flow resistance. The first flow path extends through at least one thermoelectric assembly 10 and the second flow path does not extending through the at least one thermoelectric assembly 10.

In some embodiments, the first flow path extends through a plurality of perforations 211 of at least one wall portion 209 of at least one conduit 207.

In some embodiments, the at least one wall portion 209 comprises a first wall portion 209A with a first plurality of perforations 211A and a second wall portion 209B with a second plurality of perforations 211B. The first flow path extends through the first plurality of perforations 211A outwardly from the at least one conduit 207 and through the second plurality of perforations 211B inwardly to the at least one conduit 207.

Integrated Proportional Bypass Valve

Certain embodiments described herein provide a thermoelectric power generating (TEG) system 500 comprising at least one thermoelectric subsystem 509 (e.g., at least one thermoelectric assembly 10) and at least one bypass conduit 511. The TEG system 500 further comprises at least one proportional valve 513 and is configured to receive a first working fluid (e.g., hot gas such as exhaust gas) from a source (e.g., an engine). The at least one proportional valve 513 is configured to controllably allow a first fraction of the first working fluid to flow in thermal communication with the at least one thermoelectric subsystem 509 and to controllably allow a second fraction of the first working fluid to flow through the at least one bypass conduit 511 such that the second fraction is not in thermal communication with the at least one thermoelectric subsystem 509. For example, the at least one proportional valve 513 can be integrated into the TEG system 500, the at least one bypass conduit 511 can be integrated into a main shell 515 of the TEG system 500, and the TEG system 500 can have double-wall thermal insulation 517 (e.g., top and bottom walls) that provide thermal insulation of the at least one thermoelectric subsystem 509 from the environment.

Figure 14:
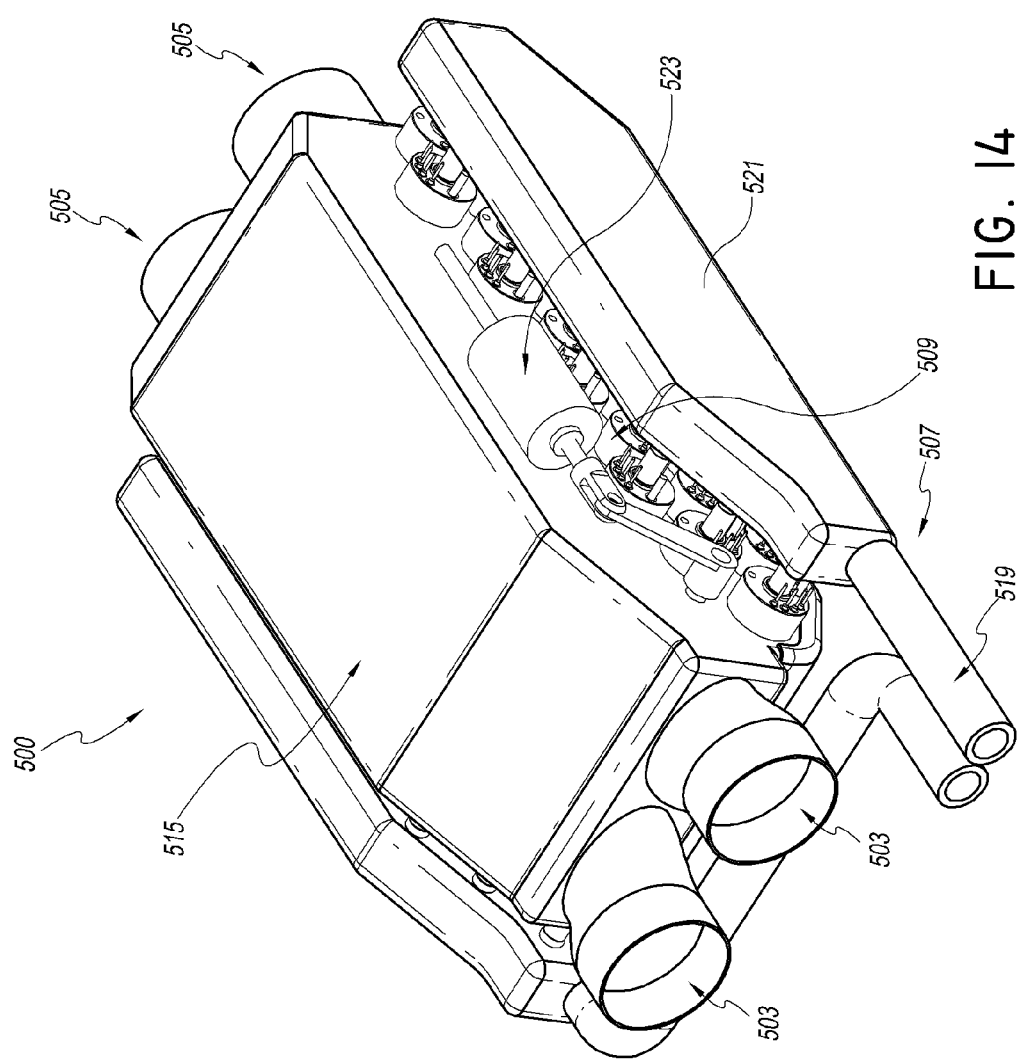
FIG. 14 schematically illustrates some external features an example thermoelectric power generating system.

FIG. 14 schematically illustrates at least some external features of an example TEG system 500 in accordance with certain embodiments described herein. The TEG system 500 can comprise a TEG main shell 515, one or more inlets 503 configured to receive the first working fluid (e.g., exhaust gas), and one or more outlets 505 configured to output the first working fluid. The TEG system 500 can further comprise a cooling subsystem 507 (e.g., coolant circuit) configured to receive a second working fluid (e.g., coolant, water) that flows in thermal communication with the at least one thermoelectric subsystem 509. For example, the cooling subsystem 507 can comprise one or more coolant conduits 519 configured to receive and output the second working fluid and one or more coolant manifolds 521 (e.g., one on each side of the TEG system 500) configured to distribute the second working fluid to and from the at least one thermoelectric subsystem 509. The TEG system 500 can further comprise at least one valve actuator 523 in mechanical communication with the at least one proportional valve 513 and configured to control the at least one proportional valve 513. In certain embodiments, the TEG system 500 can include some or all of the structures described above with regard to FIGS. 1-11.

Figure 15B:
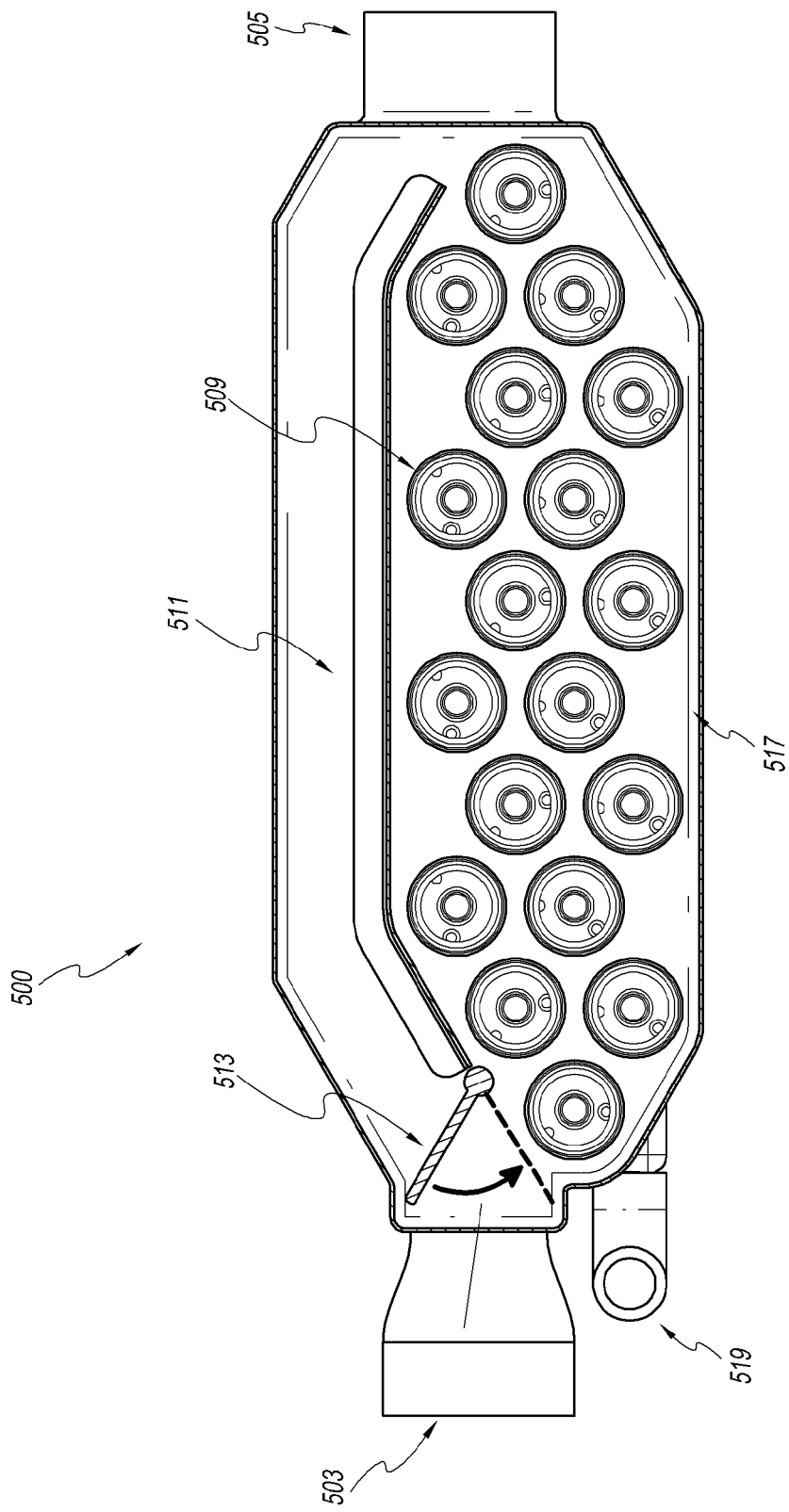

FIGS. 15A and 15B schematically illustrate at least some internal features of an example TEG system 500 in accordance with certain embodiments described herein. The TEG system 500 can comprise a double wall thermal insulation structure 517 that is configured to at least partially thermally isolate the at least thermoelectric subsystem 509 (e.g., at least one thermoelectric assembly 10) from the surrounding environment, from the at least one bypass conduit 511, or both. The region between the two walls of the double-wall thermal insulation structure can contain a generally thermally insulative material.

Figure 16A:
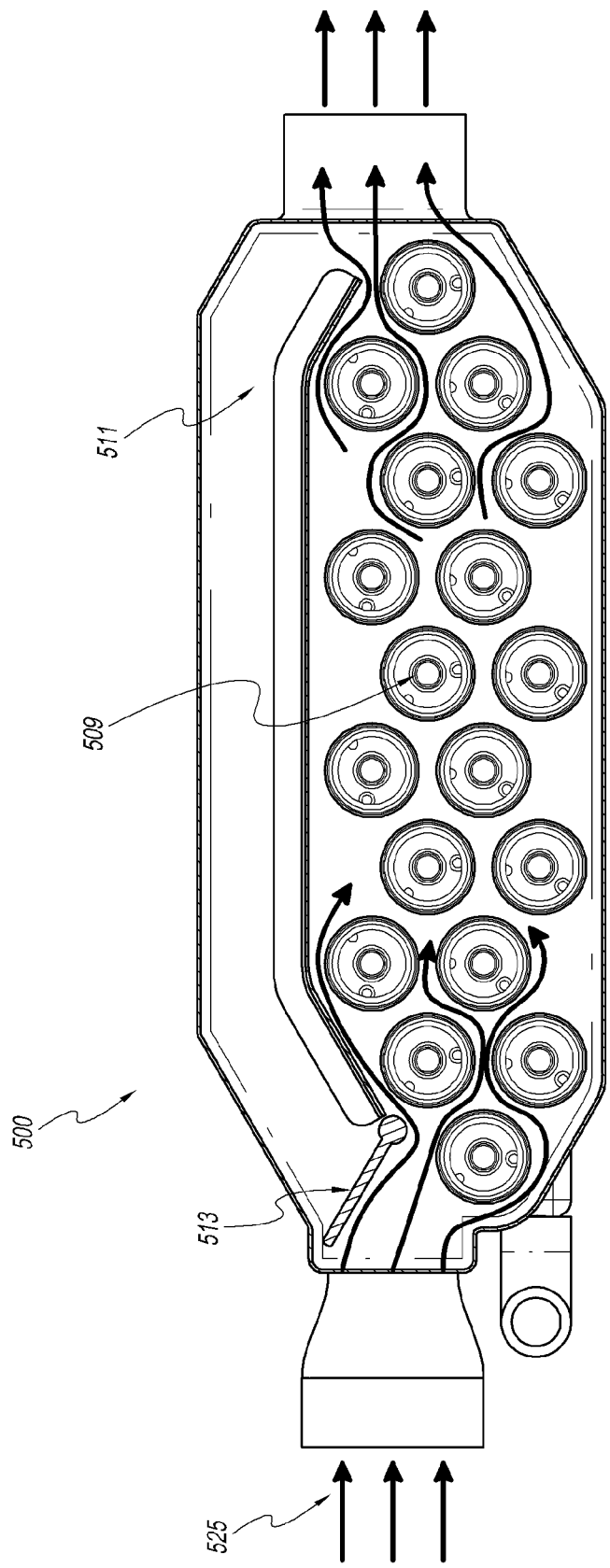
FIG. 16A-16C schematically illustrate an example thermoelectric power generating system having a valve in three different positions.
Figure 16B:
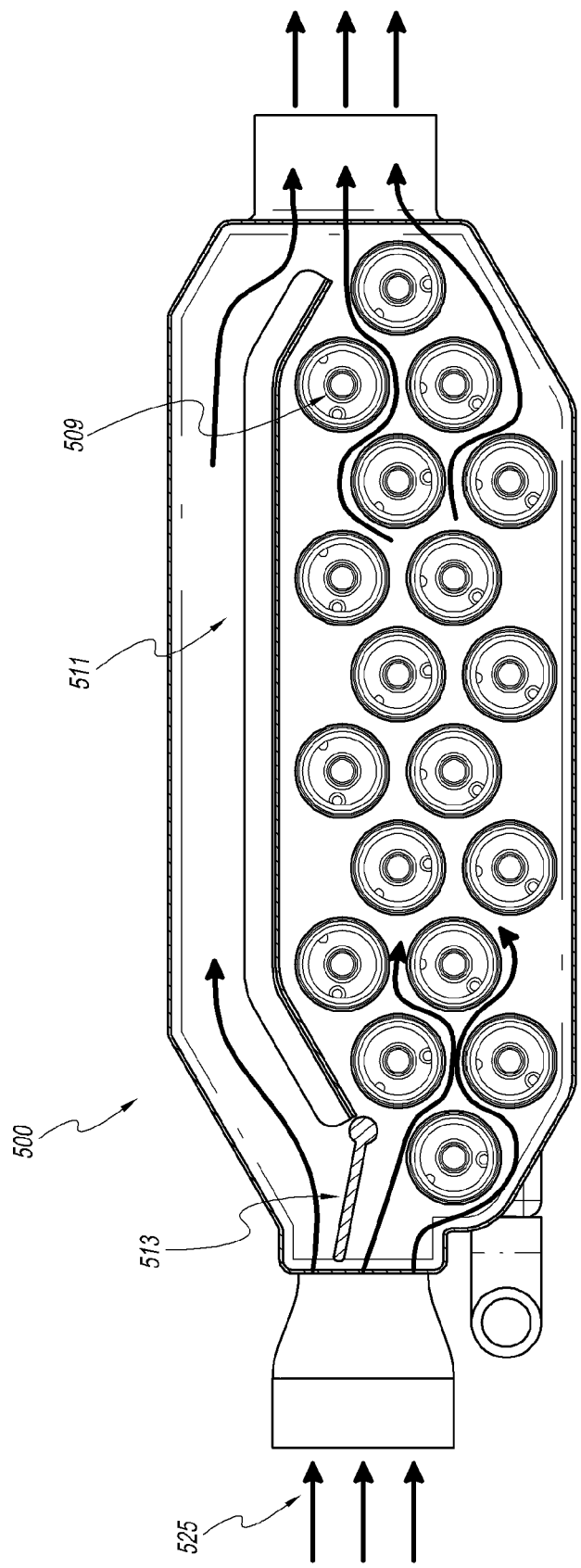
Figure 16C:
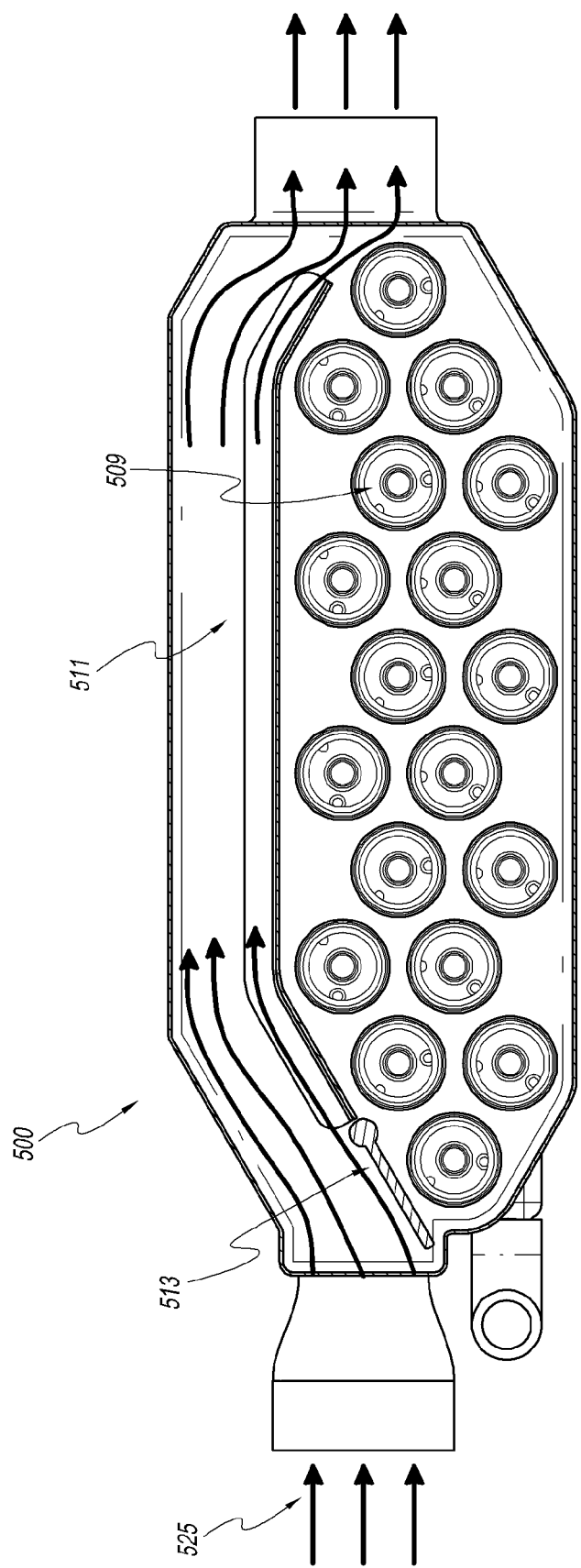

FIGS. 16A-16C schematically illustrate the at least one proportional valve 513 in three different positions in accordance with certain embodiments described herein. The at least one proportional valve 513 can comprise one or more movable structures (e.g., flap or flaps) configured to vary the entrance area of the at least one bypass conduit 511 through which the first working fluid can flow and to vary the entrance area of the thermoelectric subsystem 509 through which the first working fluid can flow. For example, the at least one proportional valve 513 can be controlled to vary the first fraction of the working fluid to be any value between zero and 100% of the received working fluid (e.g., 0%, 5%, 10%, 15%, 20%, 25%, 30%, 40%, 50%, 60%, 70%, 75%, 80%, 85%, 90%, 95%, 100%). The at least one proportional valve 513 can be controlled to vary the second fraction of the working fluid to be any value between zero and 100% of the received working fluid (e.g., 0%, 5%, 10%, 15%, 20%, 25%, 30%, 40%, 50%, 60%, 70%, 75%, 80%, 85%, 90%, 95%, 100%). In certain embodiments having a single bypass conduit 511 and a plurality of thermoelectric subsystems 509 (e.g., as shown in FIGS. 14, 15A, and 15B), the at least one proportional valve 513 (e.g., a single proportional valve) can be configured to direct a first portion of the first working fluid through the bypass conduit 511 and the remaining portion of the first working fluid through the thermoelectric subsystems 509. FIG. 16A illustrates the at least one proportional valve 513 in a position that controls the flow such that 100% of the flow (indicated by arrows 525) is through the thermoelectric subsystem 509. FIG. 16B illustrates the at least one proportional valve 513 in a position that controls the flow such that a fraction of the flow is through the thermoelectric subsystem 509 and the remaining fraction is through the bypass conduit 511. FIG. 16C illustrates the at least one proportional valve 513 in a position that controls the flow such that 100% of the flow is through the bypass conduit 511.

As discussed in accordance with other embodiments above, the at least one thermoelectric subsystem 509 can comprise at least one "cartridge-based thermoelectric system" or "cartridge" with at least one thermoelectric assembly or at least one thermoelectric system as disclosed in U.S. Pat. Appl. Publ. No. 2013/0104953 which is incorporated in its entirety by reference herein. The thermoelectric subsystem 509 can be configured to apply a temperature differential across an array of thermoelectric elements of the thermoelectric subsystem 509 in accordance with certain embodiments described herein. For example, FIG. 6B of U.S. Pat. Appl. Publ. No. 2013/0104953 illustrates a perspective cross-sectional view of an example cartridge of the thermoelectric subsystem 509 compatible with certain embodiments described herein. The cartridge of this figure can include an anodized aluminum "cold side" tube which is in thermal communication with a plurality of thermoelectric elements, and a plurality of "hot side" heat transfer assemblies in thermal communication with the plurality of thermoelectric elements, such that a temperature differential is applied across the thermoelectric elements. As described in U.S. Pat. Appl. Publ. No. 2013/0104953 regarding certain configurations, the "cold side" tube can have a first working fluid (e.g., water) flowing through it, and the "hot side" heat transfer assemblies can have a second working fluid (e.g., gas or vapor) flowing across the "hot side" heat transfer assemblies. The at least one proportional valve 513 can be used in a TEG system 100 that also includes one or more of the structures described above with regard to FIGS. 1-11.

Discussion of the various embodiments herein has generally followed the embodiments schematically illustrated in the figures. However, it is contemplated that the particular features, structures, or characteristics of any embodiments discussed herein may be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures.

Various embodiments have been described above. Although the inventions have been described with reference to these specific embodiments, the descriptions are intended to be illustrative and are not intended to be limiting. Various modifications and applications may occur to those skilled in the art without departing from the spirit and scope of the inventions as defined in the appended claims.

What is claimed is:

1. A thermoelectric power generating system comprising:
at least one thermoelectric assembly comprising:
at least one first heat exchanger in thermal communication with at least a first portion of a first working fluid, the first portion of the first working fluid flowing through the at least one thermoelectric assembly;
a plurality of thermoelectric elements in thermal communication with the at least one first heat exchanger; and
at least one second heat exchanger in thermal communication with the plurality of thermoelectric elements and with a second working fluid flowing through the at least one thermoelectric assembly, the second working fluid cooler than the first working fluid;
at least one heat exchanger portion configured to have at least some of the first portion of the first working fluid flow through the at least one heat exchanger portion after having flowed through the at least one thermoelectric assembly, the at least one heat exchanger portion configured to recover heat from the at least some of the first portion of the first working fluid;
at least one bypass conduit; and
at least one valve configured to selectively allow at least the first portion of the first working fluid to flow through the at least one first heat exchanger and to selectively allow at least a second portion of the first working fluid to flow through the bypass conduit, wherein the at least one heat exchanger portion is configured to receive at least some of the second portion of the first working fluid after having flowed through the at least one bypass conduit and to recover heat from the at least some of the second portion of the first working fluid.

2. The system of claim 1, wherein the at least one heat exchanger portion comprises a first conduit through which the at least some of the first portion of the first working fluid flows and a second conduit through which at least a portion of the second working fluid flows, wherein the second conduit is in thermal communication with the first conduit such that the portion of the second working fluid receives heat from the at least some of the first portion of the first working fluid.

3. The system of claim 1, wherein the at least one thermoelectric assembly is configured to convert high-temperature heat of the first working fluid to electricity such that low-temperature heat of the first working fluid is received by the at least one heat exchanger portion.

4. The system of claim 1, wherein the at least one valve comprises a proportional valve.

5. The system of claim 1, wherein the at least one valve comprises at least one component that is sensitive to high temperatures, and the at least one component is in thermal communication with the second working fluid.

6. The system of claim 1, wherein the first working fluid comprises exhaust gas from an engine, and the at least one heat exchanger portion is further configured to use the recovered heat from the at least some of the second portion of the first working fluid to warm an engine block of the engine.

7. The system of claim 1, further comprising at least one second heat exchanger portion configured to have at least the first portion of the first working fluid flow through the at least one second heat exchanger portion prior to flowing through the at least one thermoelectric assembly, wherein the at least one second heat exchanger portion is configured to reduce a temperature of the first portion of the first working fluid.

8. The system of claim 1, wherein the first working fluid comprises exhaust gas from an engine, and the at least one thermoelectric assembly is integrated into at least one muffler of the engine.

9. The system of claim 1, wherein the first working fluid comprises exhaust gas from an engine, and the at least one heat exchanger portion is further configured to use the recovered heat from the at least some of the second portion of the first working fluid to warm a passenger compartment of a vehicle comprising the engine.

10. The system of claim 1, wherein the first working fluid comprises exhaust gas from an engine, and the at least one heat exchanger portion is further configured to use the recovered heat from the at least some of the second portion of the first working fluid to warm a catalytic converter of the engine.

11. The system of claim 1, further comprising:
a first flow path with a first flow resistance, the first flow path through the at least one thermoelectric assembly;
at least one conduit comprising at least one wall portion having a plurality of perforations, wherein the first flow path extends through the plurality of perforations into the at least one thermoelectric assembly; and
a second flow path with a second flow resistance lower than the first flow resistance, the second flow path bypassing the at least one thermoelectric assembly.

12. The system of claim 11, wherein the at least one conduit further comprises an inlet and an outlet, and the at least one valve is between the inlet and the outlet.

13. The system of claim 11, wherein the at least one wall portion comprises a first wall portion with a first plurality of perforations and a second wall portion with a second plurality of perforations, the at least one valve between the first wall portion and the second wall portion, the first flow path extending through the first plurality of perforations outwardly from the at least one conduit and through the second plurality of perforations inwardly to the at least one conduit, the second flow path not extending through the first plurality of perforations and not through the second plurality of perforations.

* * * * *